US012690327B2

(12) United States Patent
Hwang et al.

(10) Patent No.: US 12,690,327 B2
(45) Date of Patent: Jul. 21, 2026

(54) DISPLAY APPARATUS AND METHOD OF MANUFACTURING THE SAME

(71) Applicant: Samsung Display Co., Ltd., Yongin-si (KR)

(72) Inventors: Doyeon Hwang, Yongin-si (KR); Kwangmin Kim, Yongin-si (KR); Kiwook Kim, Yongin-si (KR); Wonkyu Kwak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 475 days.

(21) Appl. No.: 18/317,782

(22) Filed: May 15, 2023

(65) Prior Publication Data

US 2023/0371310 A1 Nov. 16, 2023

(30) Foreign Application Priority Data

May 16, 2022 (KR) ......................... 10-2022-0059839
Feb. 17, 2023 (KR) ......................... 10-2023-0021589

(51) Int. Cl.
*H10K 59/121* (2023.01)
*H10K 59/12* (2023.01)
*H10K 59/122* (2023.01)
*H10K 59/131* (2023.01)
*H10K 71/70* (2023.01)

(52) U.S. Cl.
CPC ..... *H10K 59/1213* (2023.02); *H10K 59/1201* (2023.02); *H10K 59/1216* (2023.02); *H10K 59/122* (2023.02); *H10K 59/131* (2023.02); *H10K 71/70* (2023.02)

(58) Field of Classification Search
CPC ........... H10K 59/1213; H10K 59/1201; H10K 59/1216; H10K 59/122; H10K 59/131; H10K 71/70; H10K 59/12; H10K 59/1315; H10D 86/441; H10D 86/481; H10D 86/423; H10D 86/60; H10P 74/27–277
See application file for complete search history.

(56) References Cited

U.S. PATENT DOCUMENTS

| | | | |
|---|---|---|---|
| 8,107,044 B2 | 1/2012 | Choi et al. | |
| 9,454,932 B2 | 9/2016 | Ono et al. | |
| 10,255,855 B2 | 4/2019 | Park et al. | |
| 2005/0072754 A1* | 4/2005 | Shih | ................. H10D 86/0231 257/E27.113 |

(Continued)

FOREIGN PATENT DOCUMENTS

| | | |
|---|---|---|
| JP | 5756865 B2 | 6/2015 |
| KR | 10-1539953 B1 | 7/2016 |

(Continued)

*Primary Examiner* — Chad M Dicke
*Assistant Examiner* — Gary Abel
(74) *Attorney, Agent, or Firm* — Womble Bond Dickinson (US) LLP

(57) ABSTRACT

A display apparatus includes: a substrate; a pixel circuit on the substrate and including a first transistor and a second transistor; an organic light-emitting diode connected to the pixel circuit; a connection line including a first connection line connected to the first transistor and a second connection line connected to the second transistor; and a disconnection portion configured to disconnect the first connection line and the second connection line from each other.

15 Claims, 15 Drawing Sheets

(56) References Cited

U.S. PATENT DOCUMENTS

| | | | |
|---|---|---|---|
| 2010/0019996 A1* | 1/2010 | You | H10D 86/0231 |
| | | | 345/76 |
| 2018/0233552 A1* | 8/2018 | Lee | H10D 86/411 |
| 2020/0227505 A1* | 7/2020 | Kim | H10K 59/80 |
| 2021/0134917 A1* | 5/2021 | Li | G09G 3/3275 |
| 2022/0013612 A1* | 1/2022 | Xu | H10K 59/1213 |
| 2022/0052149 A1* | 2/2022 | Wu | H10K 50/841 |
| 2022/0069260 A1* | 3/2022 | Han | H10K 59/8792 |

FOREIGN PATENT DOCUMENTS

| | | | |
|---|---|---|---|
| KR | 10-2017-0049787 A | 5/2017 |
| KR | 10-2017-0135650 A | 12/2017 |

* cited by examiner

FIG. 5

DISPLAY APPARATUS AND METHOD OF MANUFACTURING THE SAME

CROSS-REFERENCE TO RELATED APPLICATIONS

The present application claims priority to and the benefit of Korean Patent Application Nos. 10-2022-0059839, filed on May 16, 2022, and 10-2023-0021589, filed on Feb. 17, 2023, in the Korean Intellectual Property Office, the entire disclosures of each of which are incorporated herein by reference.

BACKGROUND

1. Field

Aspects of one or more embodiments relate to a display apparatus and a method of manufacturing the same.

2. Description of the Related Art

A display apparatus visually displays data. A display apparatus may be used as a display for compact products or electronic devices, such as mobile phones and the like, or for large products or electronic devices, such as televisions and the like.

A display apparatus generally includes a plurality of pixels that receive electrical signals and emit light to display images to the outside. Each pixel includes generally a display element. For example, an organic light-emitting display apparatus includes an organic light-emitting diode (OLED) as a display element. In a general organic light-emitting display apparatus, a thin film transistor and an organic light-emitting diode may be formed on a substrate. As the organic light-emitting diode emits light by itself, the organic light-emitting display apparatus is operated.

Recently, as the uses of display apparatuses have diversified, various attempts have been made to improve the quality of display apparatuses.

The above information disclosed in this Background section is only for enhancement of understanding of the background and therefore the information discussed in this Background section does not necessarily constitute prior art.

SUMMARY

Aspects of one or more embodiments include a display apparatus, in which an array test of a pixel circuit may be performed so that the yield of a manufacturing process may be relatively improved, and a method of manufacturing the display apparatus.

However, such characteristics are merely examples, and the scope of embodiments according to the present disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate, a pixel circuit on the substrate and including a first transistor and a second transistor, an organic light-emitting diode connected to the pixel circuit, a connection line including a first connection line connected to the first transistor and a second connection line connected to the second transistor, and a disconnection portion disconnecting the first connection line and the second connection line from each other.

According to some embodiments, the first connection line and the second connection line may be formed on the same layer and include the same material.

According to some embodiments, the first transistor may include a first semiconductor layer on the substrate and a first gate electrode insulated from the first semiconductor layer, and the second transistor may include a second semiconductor layer on the substrate and a second gate electrode insulated from the second semiconductor layer.

According to some embodiments, the pixel circuit may further include a first capacitor including a first lower electrode on the substrate and a first upper electrode insulated from the first lower electrode, and a second capacitor including a second lower electrode spaced apart from the first lower electrode and including a second upper electrode insulated from the second lower electrode.

According to some embodiments, the first gate electrode and the first lower electrode may be formed on the same layer and include the same material.

According to some embodiments, the connection line may be on the same layer as the first gate electrode.

According to some embodiments, the connection line may be on the same layer as the first upper electrode.

According to some embodiments, the first connection line may be connected to the first semiconductor layer, and the second connection line may be connected to the second semiconductor layer.

According to some embodiments, the display apparatus may further include a first line connecting the first connection line with the first semiconductor layer, and a second line connecting the second connection line with the second semiconductor layer.

According to some embodiments, the display apparatus may further include a first organic insulating layer covering the first line, wherein a first hole corresponding to the disconnection portion is defined in the first organic insulating layer.

According to some embodiments, the display apparatus may further include a third line on the first organic insulating layer, and a second organic insulating layer covering the third line, wherein a second hole corresponding to the disconnection portion is defined in the second organic insulating layer.

According to some embodiments, the width across the first hole may be greater than the width across the second hole.

According to some embodiments, the organic light-emitting diode may include a pixel electrode, a light-emitting layer, and a counter electrode, and the pixel electrode may not overlap the disconnection portion.

According to some embodiments, the display apparatus may further include a pixel defining layer exposing at least a portion of the pixel electrode, wherein at least a portion of the pixel defining layer may be on the disconnection portion.

According to some embodiments, the pixel defining layer may be in direct contact with the connection line.

According to one or more embodiments, a method of manufacturing a display apparatus, the method including forming, on a substrate, a pixel circuit including a first transistor and a second transistor and a connection line connecting the first transistor with the second transistor, performing an array test on the pixel circuit, and disconnecting the connection line.

According to some embodiments, the forming, on the substrate, a pixel circuit including a first transistor and a second transistor and a connection line connecting the first transistor with the second transistor may include forming, on the substrate, a first semiconductor layer and a second semiconductor layer, forming a first insulating layer on the first semiconductor layer and the second semiconductor layer, forming the connection line on the first insulating layer, forming a second insulating layer on the connection line, wherein a first hole for exposing at least a portion of the connection line is defined in the second insulating layer, forming a first line and a second line on the second insulating layer, forming a first organic insulating layer on the first line and the second line, wherein a second hole for exposing at least a portion of the connection line is defined in the first organic insulating layer, and forming a third line on the first organic insulating layer.

According to some embodiments, the first transistor may further include a first gate electrode insulated from the first semiconductor layer, and the first gate electrode and the connection line may be formed on the same layer and include the same material.

According to some embodiments, the first semiconductor layer and the connection line may be connected to each other through the first line.

According to some embodiments, the second semiconductor layer and the connection line may be connected to each other through the second line.

According to some embodiments, the method may further include, after the forming of the third line, forming a second organic insulating layer on the third line, wherein a third hole for exposing at least a portion of the connection line is defined in the second organic insulating layer, and forming a pattern material on the connection line and the second organic insulating layer.

According to some embodiments, the width across the first hole may be greater than the width across the second hole.

According to some embodiments, the width across the second hole may be greater than the width across the third hole.

According to some embodiments, in the disconnecting of the connection line, the pattern material may be etched to form a pixel electrode, and the connection line may be etched to form a disconnection portion.

According to some embodiments, the pixel electrode may not overlap the disconnection portion.

According to some embodiments, the method may further include, after the disconnecting of the connection line, forming a pixel defining layer for exposing at least a portion of the pixel electrode.

According to some embodiments, at least a portion of the pixel defining layer may be formed on the disconnection portion.

According to some embodiments, the pixel defining layer may be in direct contact with the connection line.

According to some embodiments, the pixel circuit may include a first capacitor and a second capacitor.

According to some embodiments, the first capacitor may include a first lower electrode and a first upper electrode insulated from the first lower electrode, and the second capacitor may include a second lower electrode spaced apart from the first lower electrode and a second upper electrode insulated from the second lower electrode.

Other aspects, features, and characteristics than those described above will become apparent from the following drawings, claims, and detailed description of the disclosure

BRIEF DESCRIPTION OF THE DRAWINGS

The above and other aspects, features, and characteristics of certain embodiments of the disclosure will be more apparent from the following description taken in conjunction with the accompanying drawings, in which:

FIG. 5 is a schematic cross-sectional view of a display apparatus according to some embodiments;

DETAILED DESCRIPTION

Figure 1:
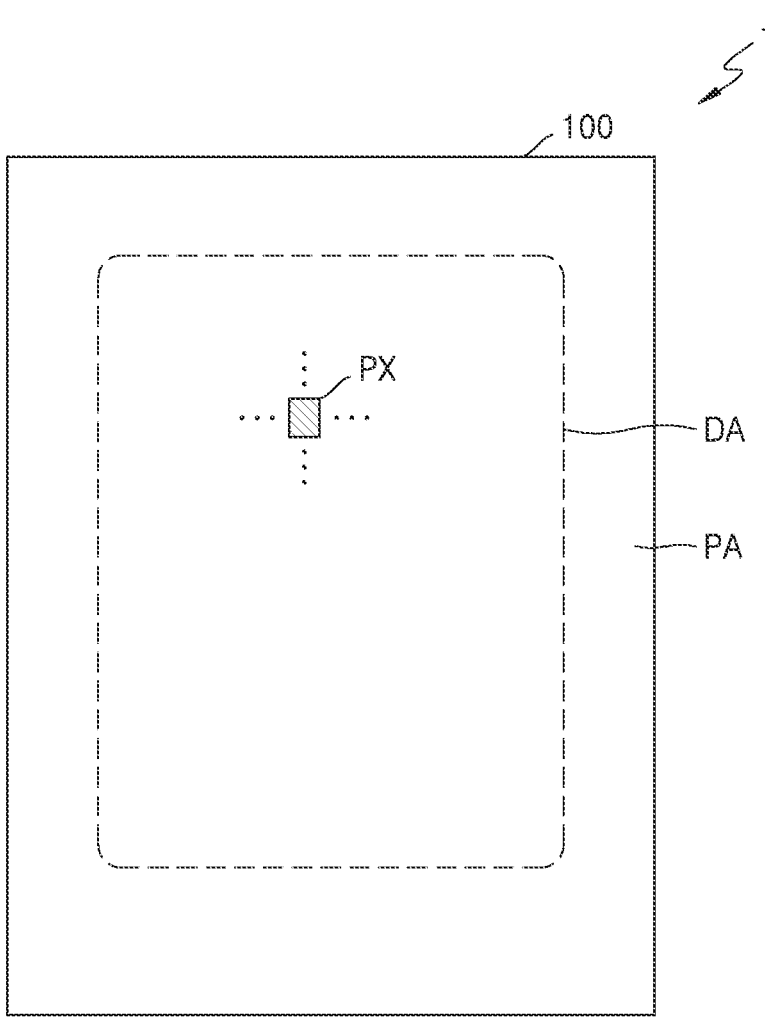
FIG. 1 is a schematic plan view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

In the following embodiments, while such terms as "first," "second," etc., may be used to describe various elements, such elements must not be limited to the above terms.

In the following embodiments, the expression of singularity in the specification includes the expression of plurality unless clearly specified otherwise in context.

In the following embodiments, it will be further understood that the terms "comprises" and/or "comprising" used herein specify the presence of stated features or components, but do not preclude the presence or addition of one or more other features or components.

In the following embodiments, it will be understood that when an element, such as a layer, a film, a region, or a plate, is referred to as being "on" another element, the element can be directly on the other element or intervening elements may be present thereon.

Sizes of elements in the drawings may be exaggerated for convenience of explanation. For example, because sizes and thicknesses of components in the drawings are arbitrarily illustrated for convenience of explanation, the following embodiments are not limited thereto.

In the specification, the expression such as "at least one of A and B" may include A, B, or A and B. Furthermore, in the specification, the expression such as "at least one of A and B" may include A, B, or A and B.

In the following embodiments, the meaning that the wiring "extends in the first direction or the second direction" includes not only extending in a linear shape, but also extending in a zigzag or a curve along the first direction or the second direction.

In the following embodiments, when referred to as "in a plan view," this means when an object part is viewed from above, and when it is referred to as "in a cross-sectional view," it means when the cross-section where the object part is cut vertically is viewed from the side. In the following embodiments below, when referred to as "overlapping," it includes overlapping "in a plan view" and "in a cross-sectional view."

Hereinafter, aspects of some embodiments will be described in more detail with reference to the accompanying drawings, and in the description with reference to the drawings, the same or corresponding constituents are indicated by the same reference numerals and redundant descriptions thereof are omitted.

FIG. 1 is a schematic plan view of a display apparatus 1 according to some embodiments.

Referring to FIG. 1, the display apparatus 1 may include a display area DA at which images are displayed and a peripheral area PA arranged around (e.g., in a periphery or outside a footprint of) the display area DA. The display apparatus 1 may display images to the outside by using light emitted from the display area DA.

A substrate 100 may include various materials such as glass, metal, plastic, or the like. According to some embodiments, the substrate 100 may include a flexible material. The flexible material may be a material that is well flexible, bent, folded, or rolled. For example, the flexible material may include ultra-thin glass, metal, or plastic.

A pixel PX including various display elements such as an organic light-emitting diode (OLED) may be arranged in the display area DA of the substrate 100. The pixel PX includes a plurality of pixels, and the pixels PX are arranged in various forms, such as a stripe arrangement, a pentile arrangement, a mosaic arrangement, and the like, and may implement an image. Although a single pixel PX is illustrated in FIG. 1, as a person having ordinary skill in the art would recognize, the display apparatus 1 may include any suitable number of pixels PX according to the design and size of the display apparatus 1.

According to some embodiments, when viewed in a plan view, the display area DA may have a rectangular shape (e.g., with square, angled, or rounded corners) as illustrated in FIG. 1. Alternatively, the display area DA may have a polygonal shape, such as a triangular shape, a pentagonal shape, a hexagonal shape, and the like, a circular shape, an oval shape, an amorphous shape, and the like.

The peripheral area PA is arranged around the display area DA and no image is displayed therein. Various wires through which electrical signals to be applied to the display area DA are transmitted, and pads on which a printed circuit board or a driver IC chip is attached pads may be located in the peripheral area PA.

Figure 2:
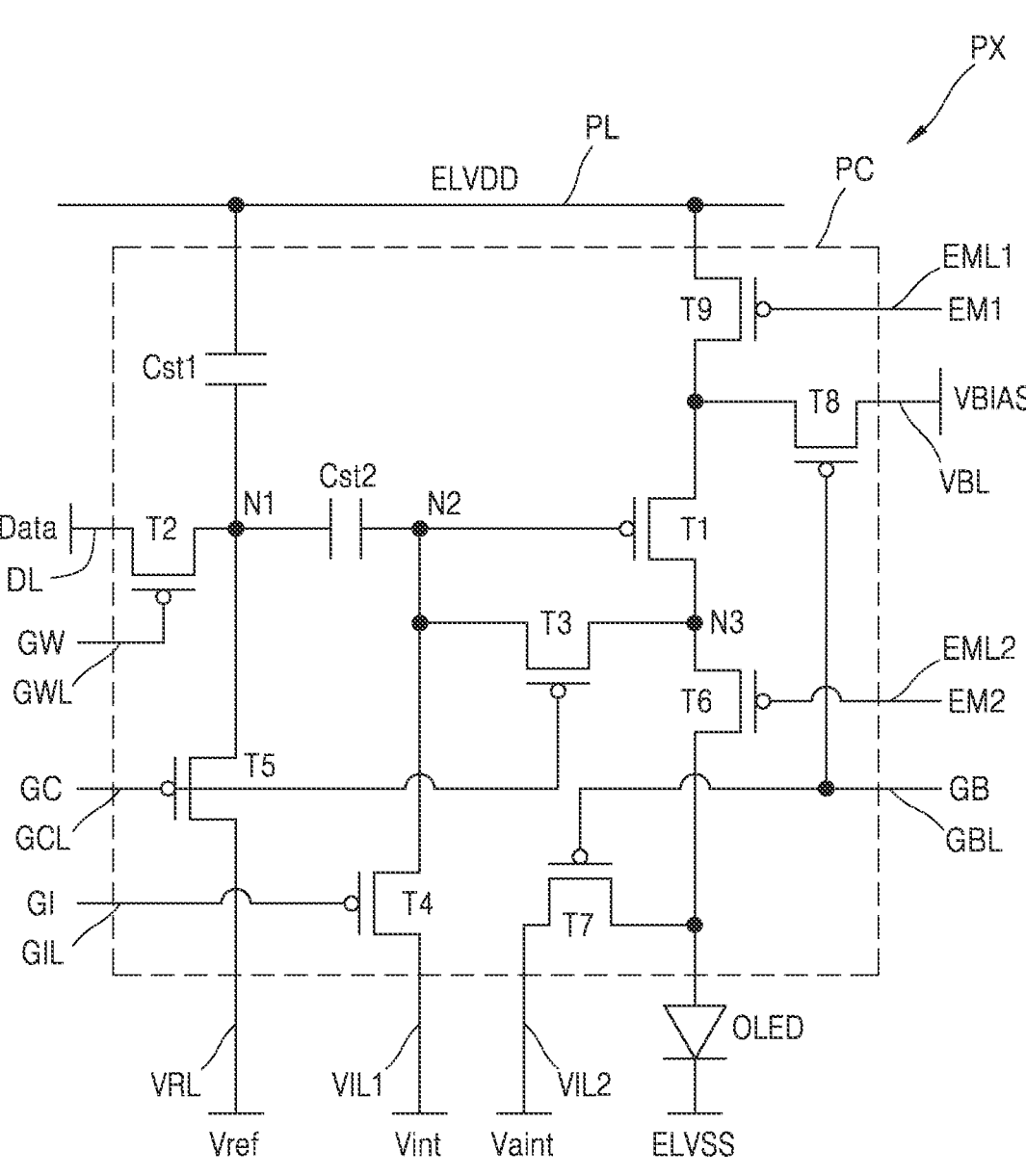
FIG. 2 is a schematic equivalent circuit diagram of a pixel circuit of a pixel included in a display apparatus according to some embodiments.

FIG. 2 is a schematic equivalent circuit diagram of a pixel circuit of a pixel included in a display apparatus according to some embodiments.

Referring to FIG. 2, the pixel PX may include an organic light-emitting diode OLED as a display element, and a pixel circuit PC connected to the organic light-emitting diode OLED. The pixel circuit PC may include first to ninth transistors T1 to T9 and first and second capacitors Cst1 and Cst2. Although various components are illustrated and described with respect to FIG. 2, in some embodiments according to the present disclosure, the pixel PX may include additional components or fewer components without departing from the spirit and scope of embodiments according to the present disclosure.

A first transistor T1 may be a driving transistor in which the size of a drain current is determined according to a gate-source voltage, and the second to ninth transistors T2 to T9 may be switching transistors that are turned on/off according to the gate-source voltage, substantially a gate voltage. The first to ninth transistors T1 to T9 may be thin film transistors.

According to some embodiments, a first scan line GWL for transmitting a first scan signal GW, a second scan line GCL for transmitting a second scan signal GC, a third scan line GIL for transmitting a third scan signal GI, a fourth scan line GBL for transmitting a fourth scan signal GB, a first emission control line EML1 for transmitting a first emission control signal EM1, a second emission control line EML2 for transmitting a second emission control signal EM2, a data line DL for transmitting a data voltage (Data or data signal), a driving voltage line PL for transmitting a first power voltage ELVDD, a first initialization voltage line VIL1 for transmitting a first initialization voltage Vint, a second initialization voltage line VIL2 for transmitting a second initialization voltage Vaint, a reference voltage line VRL for transmitting a reference voltage Vref, and a bias voltage line VBL for transmitting a bias voltage VBIAS may be provided for each pixel circuit PC.

For example, it may be understood that the pixel circuit PC includes the first scan line GWL, the second scan line GCL, the third scan line GIL, the fourth scan line GBL, the first emission control line EML1, the second emission control line EML2, the data line DL, the driving voltage line PL, the first initialization voltage line VIL1, the second initialization voltage line VIL2, the reference voltage line VRL, and the bias voltage line VBL. At least one of the first scan line GWL, the second scan line GCL, the third scan line GIL, the fourth scan line GBL, the first emission control line EML1, the second emission control line EML2, the data line DL, the driving voltage line PL, the first initialization voltage line VIL1, the second initialization voltage line VIL2, the reference voltage line VRL, or the bias voltage line VBL may be shared by the neighboring pixel circuits PC.

The second transistor T2 may connect the data line DL with a first node N1 in response to the first scan signal GW applied to a second gate electrode of the second transistor T2. The second transistor T2 may have a second gate electrode to which the first scan signal GW is applied through the first scan line GWL, a second source connected to the data line DL, and a second drain connected to the first node N1.

A first capacitor Cst1 may be connected between the first node N1 and the first power voltage ELVDD. In response to the second transistor being turned on in response to the first scan signal GW being applied to the second gate electrode of the second transistor T2, the first capacitor Cst1 may store a voltage or charge (e.g., a difference between the data signal Data and the first power voltage ELVDD. A second capacitor Cst2 may be connected between the first node N1 and a second node N2.

The first transistor T1 may have a first gate connected to the second node N2, a first source connected to the driving voltage line PL through the ninth transistor T9, and a first drain connected to the organic light-emitting diode OLED through the sixth transistor T6. The first transistor T1 may output a driving current to the organic light-emitting diode OLED according to the gate-source voltage. The organic light-emitting diode OLED may receive a driving current from the first transistor T1, and may emit light with a brightness according to the amount of the driving current.

The third transistor T3 may connect the second node N2 with a third node N3 in response to the second scan signal GC being applied to a third gate electrode of the third transistor T3. The third transistor T3 may have a third gate to which the second scan signal GC is applied through the second scan line GCL, a third source connected to the second node N2, and a third drain connected to the third node N3. In this state, the positions of the third source and the third drain may be switched with (e.g., in coordination with or concurrently with) each other. Although FIG. 2 illustrates that the third transistor T3 includes one transistor, embodiments according to the present disclosure are not limited thereto. The third transistor T3 may include two transistors connected to each other in series.

The fourth transistor T4 may apply the first initialization voltage Vint to the first gate of the first transistor T1 in response to the third scan signal GI. The fourth transistor T4 may has a fourth gate connected to the third scan line GIL, a fourth source connected to the first gate of the first transistor T1, and a fourth drain connected to the first initialization voltage line VIL1. In this state, the positions of the fourth source and the fourth drain may be switched with (e.g., in coordination with or concurrently with) each other. Although FIG. 2 illustrates that the fourth transistor T4 includes one transistor, embodiments according to the present disclosure are not limited thereto. The fourth transistor T4 may include two transistors connected to each other in series.

The fifth transistor T5 may transmit the reference voltage Vref to the first node N1 in response to the second scan signal GC. The fifth transistor T5 may have a fifth gate connected to the second scan line GCL, a fifth source connected to the reference voltage line VRL, and a fifth drain connected to the first node N1. In this state, the positions of the fifth source and the fifth drain may be switched with (e.g., in coordination with or concurrently with) each other.

The seventh transistor T7 may apply the second initialization voltage Vaint to the anode (e.g., a pixel electrode) of the organic light-emitting diode OLED in response to the fourth scan signal GB. The seventh transistor T7 may have a seventh gate connected to the fourth scan line GBL, a seventh source connected to the anode of the organic light-emitting diode OLED, and a seventh drain connected to the second initialization voltage line VIL2. In this state, positions of the seventh source and the seventh drain may be switched with (e.g., in coordination with or concurrently with) each other.

The ninth transistor T9 may connect the driving voltage line PL with the first source of the first transistor T1 in response to the first emission control signal EM1. The ninth transistor T9 may have a ninth gate connected to the first emission control line EML1, a ninth source connected to the driving voltage line PL, and a ninth drain connected to the first source of the first transistor T1. In this state, the positions of the ninth source and the ninth drain may be switched with (e.g., in coordination with or concurrently with) each other.

The sixth transistor T6 may connect the first drain of the first transistor T1 with the anode of the organic light-emitting diode OLED in response to the second emission control signal EM2. The sixth transistor T6 may have a sixth gate connected to the second emission control line EML2, a sixth source connected to the first drain of the first transistor T1, and a sixth drain connected to the anode of the organic light-emitting diode OLED. In this state, the positions of the sixth source and the sixth drain may be switched with (e.g., in coordination with or concurrently with) each other.

The eighth transistor T8 may apply the bias voltage VBIAS to the first source of the first transistor T1 in response to the fourth scan signal GB. The eighth transistor T8 may have an eighth gate connected to the fourth scan line GBL, an eighth source connected to the first source of the first transistor T1, and an eighth drain connected to the bias voltage line VBL. In this state, the positions of the eighth source and the eighth drain may be switched with (e.g., in coordination with or concurrently with) each other.

Although FIG. 2 illustrates that the ninth transistor T9 and the sixth transistor T6 are connected to different emission control lines EML1 and EML2, embodiments according to the present disclosure are not limited thereto. The ninth transistor T9 and the sixth transistor T6 may be connected to one emission control line.

The organic light-emitting diode OLED may include a pixel electrode (anode) and a counter electrode (cathode) facing the pixel electrode, and the counter electrode may receive a second power voltage ELVSS. The counter electrode may be a common electrode that is common for the pixels PX of FIG. 1.

Although FIG. 2 illustrates that the first to ninth transistors T1 to T9 of the pixel circuit PC are P-type transistors, embodiments according to the present disclosure are not limited thereto. Various embodiments are possible, for example, the transistors of the pixel circuit PC may be N-type transistors, some may be P-type transistors and the other may be N-type transistors, and the like.

Figure 3:
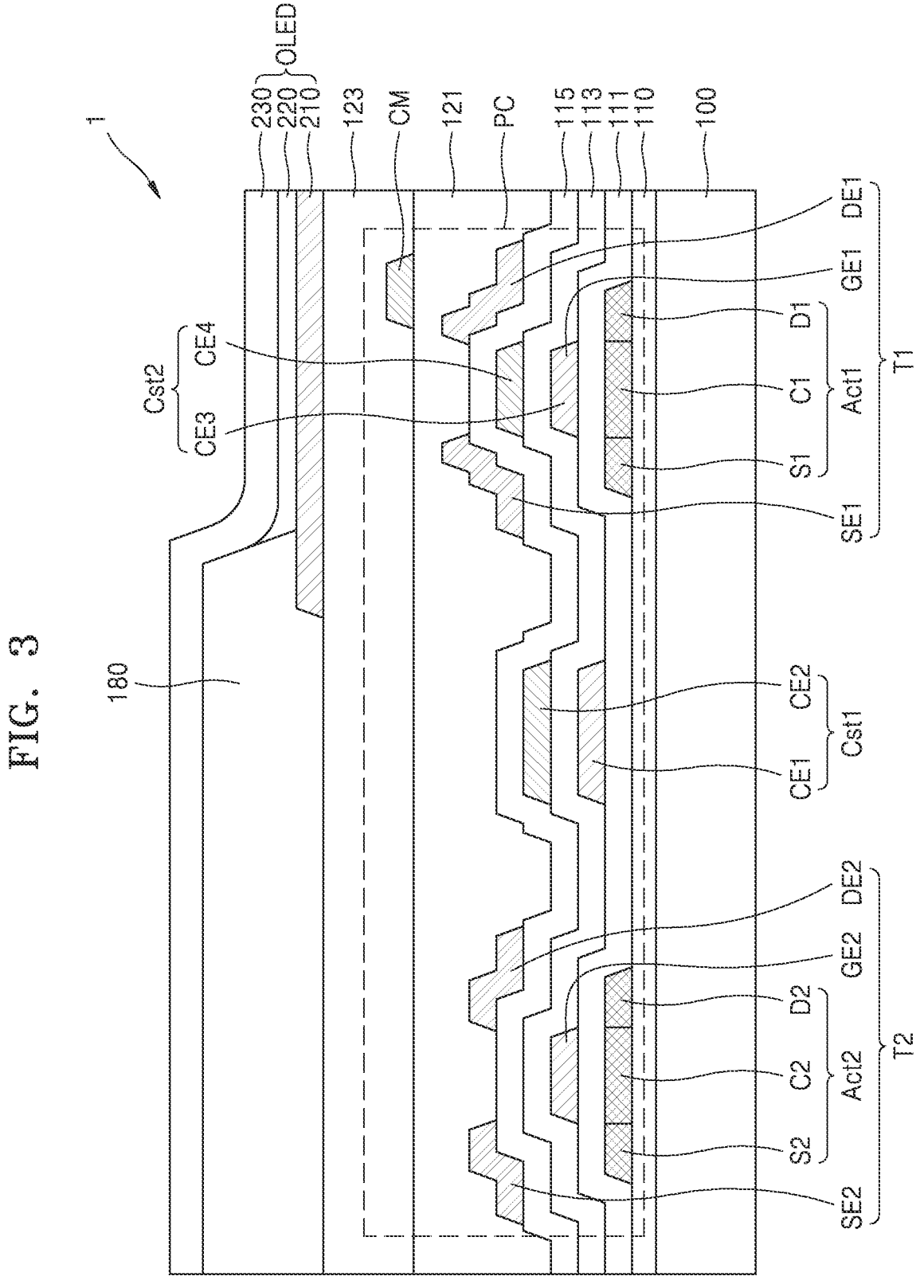
FIG. 3 is a schematic cross-sectional view of a display apparatus according to some embodiments.

FIG. 3 is a schematic cross-sectional view of a display apparatus according to some embodiments. For example, FIG. 3 is a schematic cross-sectional view of the first transistor T1, the second transistor T2, the first capacitor Cst1, and the second capacitor Cst2 of FIG. 2.

Referring to FIG. 3, the display apparatus 1 may include the substrate 100, the pixel circuit PC, and the organic light-emitting diode OLED. The pixel circuit PC may include the first transistor T1, the second transistor T2, the first capacitor Cst1, and the second capacitor Cst2. The organic light-emitting diode OLED may include a pixel electrode 210, a light-emitting layer 220 and a counter electrode 230.

The substrate 100 may include a glass material, a ceramic material, a metal material, or a flexible or bendable material. When the substrate 100 is flexible or bendable, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single layer or multilayer structure of the material described above, and for a multilayer structure, the substrate 100 may further include an inorganic layer. According to some embodiments, the substrate 100 may have a structure of an organic material/an inorganic material/an organic material/an inorganic material.

A buffer layer 110 may be located on the substrate 100. The buffer layer 110 may reduce or prevent infiltration of foreign materials, contaminants, moisture, or external air from under the substrate 100. The buffer layer 110 may include an inorganic material such as an oxide or a nitride, an organic material, or an organic/inorganic complex, and may have a single layer or multilayer structure of an inorganic material and an organic material.

The first transistor T1, the second transistor T2, the first capacitor Cst1, and the second capacitor Cst2 may be located on the substrate 100 or the buffer layer 110. The first transistor T1 may include a first semiconductor layer Act1, a first gate electrode GE1, a first source electrode SE1, and a first drain electrode DE1. The second transistor T2 may include a second semiconductor layer Act2, a second gate electrode GE2, a second source electrode SE2, and a second drain electrode DE2. The first capacitor Cst1 may include a first lower electrode CE1 and a first upper electrode CE2. The second capacitor Cst2 may include a second lower electrode CE3 and a second upper electrode CE4.

The first semiconductor layer Act1 and the second semiconductor layer Act2 may be located on the buffer layer 110. The first semiconductor layer Act1 and the second semiconductor layer Act2 may each include a silicon semiconductor. The first semiconductor layer Act1 and the second semiconductor layer Act2 may each include polysilicon. Alternatively, the first semiconductor layer Act1 and the second semiconductor layer Act2 may each include amorphous silicon. Alternatively, the first semiconductor layer Act1 and the second semiconductor layer Act2 may each include an oxide semiconductor, an organic semiconductor, and the like.

The first semiconductor layer Act1 may include a first channel C1, a first source S1, and a first drain D1. The first source S1 and the first drain D1 may be arranged in the opposite sides of the first channel C1. The second semiconductor layer Act2 may include a second channel C2, a second source S2, and a second drain D2. The second source S2 and the second drain D2 may be arranged in the opposite sides of the second channel C2.

A first insulating layer 111 may be located on the first semiconductor layer Act1 and the second semiconductor layer Act2. The first insulating layer 111 may cover the first semiconductor layer Act1 and the second semiconductor layer Act2. The first insulating layer 111 may include an inorganic insulating material, such as a silicon oxide ($SiO_2$), a silicon nitride ($SiN_x$), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide (ZnO), and/or the like.

The first gate electrode GE1 and the second gate electrode GE2 may be located on the first insulating layer 111. The first gate electrode GE1 may overlap the first semiconductor layer Act1. For example, the first gate electrode GE1 may overlap the first channel C1. The first gate electrode GE1 may be insulated from the first semiconductor layer Act1 with the first insulating layer 111 therebetween. The second gate electrode GE2 may overlap the second semiconductor layer Act2. For example, the second gate electrode GE2 may overlap the second channel C2. The second gate electrode GE2 may be insulated from the second semiconductor layer Act2 with the first insulating layer 111 therebetween. The first gate electrode GE1 and the second gate electrode GE2 may each include a conductive material including molybdenum (Mo), aluminum (Al), copper (Cu), titanium (Ti), and the like, and may be in a multilayer or single layer including the material described above.

The first lower electrode CE1 and the second lower electrode CE3 may be located on the first insulating layer 111. The first lower electrode CE1 and the second lower electrode CE3 may be spaced apart from each other. Although FIG. 3 illustrates that the second lower electrode CE3 is integrally formed with the first gate electrode GE1, embodiments according to the present disclosure are not limited thereto. The second lower electrode CE3 may be spaced apart from the first gate electrode GE1.

The first lower electrode CE1 may be located on the same layer as and may include the same material as the first gate electrode GE1. For example, the first lower electrode CE1 and the first gate electrode GE1 may be formed in the same process. However, embodiments according to the present disclosure are not limited thereto. At least one of the first lower electrode CE1 or the second lower electrode CE3 may be located on a second insulating layer 113.

The second insulating layer 113 may be located on the first gate electrode GE1 and the second gate electrode GE2. The second insulating layer 113 may cover the first gate electrode GE1 and the second gate electrode GE2. The second insulating layer 113 may include an inorganic insulating material, such as $SiO_2$, $SiN_x$, SiON, $Al_2O_3$, $TiO_2$, $Ta_2O_5$, $HfO_2$, ZnO, and/or the like.

The first upper electrode CE2 and the second upper electrode CE4 may be located on the second insulating layer 113. The first upper electrode CE2 may at least partially overlap the first lower electrode CE1. The first upper electrode CE2 and the first lower electrode CE1 may overlap each other with the second insulating layer 113 therebetween. The second upper electrode CE4 may overlap (or at least partially overlap) the second lower electrode CE3. The second upper electrode CE4 and the second lower electrode CE3 may overlap (or at least partially overlap) each other with the second insulating layer 113 therebetween. The first upper electrode CE2 and the second upper electrode CE4 may each include a conductive material including Mo, Al, Cu, Ti, and the like, and may be formed in a multilayer or single layer including the material described above. At least one of the first upper electrode CE2 or the second upper electrode CE4 may be located on a third insulating layer 115, not on the second insulating layer 113.

While being insulated from each other, the first upper electrode CE2 and the first lower electrode CE1 may at least partially overlap each other. The first upper electrode CE2 and the first lower electrode CE1 may form the first capacitor Cst1. While being insulated from each other, the second upper electrode CE4 and the second lower electrode CE3 may at least partially overlap each other. The second upper electrode CE4 and the second lower electrode CE3 may form the second capacitor Cst2.

The third insulating layer 115 may be located on the first upper electrode CE2 and the second upper electrode CE4. The third insulating layer 115 may cover the first upper electrode CE2 and the second upper electrode CE4. The third insulating layer 115 may include an inorganic insulating material, such as $SiO_2$, $SiN_x$, SiON, $Al_2O_3$, $TiO_2$, $Ta_2O_5$, $HfO_2$, ZnO, and/or the like.

The first source electrode SE1, the first drain electrode DE1, the second source electrode SE2, and the second drain electrode DE2 may be located on the third insulating layer 115. The first source electrode SE1, the first drain electrode DE1, the second source electrode SE2, and the second drain electrode DE2 may mean electrodes respectively and electrically connected to the first source S1, the first drain D1, the second source S2, and the second drain D2. According to some embodiments, the first source electrode SE1, the first drain electrode DE1, the second source electrode SE2, and the second drain electrode DE2 may be respectively and electrically connected to the first source S1, the first drain D1, the second source S2, and the second drain D2 via contact holes defined in the first insulating layer 111, the second insulating layer 113, and the third insulating layer 115. The first source electrode SE1, the first drain electrode DE1, the second source electrode SE2, and the second drain electrode DE2 may each include a conductive material including Mo, Al, Cu, Ti, and the like, and may be formed in a multilayer or single layer including the material described above. For example, the first source electrode SE1, the first drain electrode DE1, the second source electrode SE2, and the second drain electrode DE2 may have a multilayer structure of Ti/Al/Ti.

A first organic insulating layer 121 may be located on the first source electrode SE1, the first drain electrode DE1, the second source electrode SE2, and the second drain electrode DE2. The first organic insulating layer 121 may cover the first source electrode SE1, the first drain electrode DE1, the second source electrode SE2, and the second drain electrode DE2. The first organic insulating layer 121 may include an organic insulating material, such as a general purpose polymer such as polymethylmethacrylate (PMMA) or polystyrene (PS), a polymer derivative having a phenolic group, acrylic polymer, imide-based polymer, aryl ether-based polymer, amide-based polymer, fluorine-based polymer, p-xylene-based polymer, vinyl alcohol-based polymer, and blends thereof.

According to some embodiments, the pixel circuit PC may include a connection electrode CM. The connection electrode CM may be located on the first organic insulating layer 121. In this state, the connection electrode CM may mean an electrode located on an upper surface of the first organic insulating layer 121. According to some embodiments, the connection electrode CM may be electrically connected to a source electrode or a drain electrode of a transistor via contact holes defined in the first organic insulating layer 121. The connection electrode CM may include a conductive material including Mo, Al, Cu, Ti, and the like, and may be formed in a multilayer or single layer including the material described above. For example, the connection electrode CM may have a multilayer structure of Ti/Al/Ti.

A second organic insulating layer 123 may be located on the connection electrode CM. The second organic insulating layer 123 may cover the connection electrode CM. The second organic insulating layer 123 may include an organic insulating material, such as a general purpose polymer such as polymethylmethacrylate (PMMA) or polystyrene (PS), a polymer derivative having a phenolic group, acrylic polymer, imide-based polymer, aryl ether-based polymer, amide-based polymer, fluorine-based polymer, p-xylene-based polymer, vinyl alcohol-based polymer, and blends thereof.

A pixel defining layer 180 and the organic light-emitting diode OLED may be located on the second organic insulating layer 123. The pixel electrode 210 may be located on the second organic insulating layer 123. According to some embodiments, the pixel electrode 210 and the connection electrode CM may be electrically connected to each other via a contact hole defined in the second organic insulating layer 123. In other words, the organic light-emitting diode OLED and the pixel circuit PC may be electrically connected to each other via the contact hole defined in the second organic insulating layer 123. The pixel electrode 210 may include a conductive oxide, such as an indium tin oxide (ITO), an indium zinc oxide (IZO), a zinc oxide (ZnO), an indium oxide ($In_2O_3$), an indium gallium oxide (IGO), or an aluminum zinc oxide (AZO). Alternatively, the pixel electrode 210 may include a reflective film, such as silver (Ag), magnesium (Mg), Al, platinum (Pt), palladium (Pd), gold (Au), nickel (Ni), neodymium (Nd), iridium (Ir), chromium (Cr), or a compound thereof. Alternatively, the pixel electrode 210 may further include a film formed of ITO, IZO, ZnO, or $In_2O_3$ above/below the reflective film described above.

The pixel defining layer 180, in which an opening portion for exposing at least portion of the pixel electrode 210 is defined, may be located on the pixel electrode 210. For example, the opening portion defined in the pixel defining layer 180 may expose a central portion of the pixel electrode 210. The pixel defining layer 180 may include an organic insulating material and/or an inorganic insulating material.

The light-emitting layer 220 may be located on the pixel electrode 210. According to some embodiments, a first functional layer and a second functional layer may be respectively located below and above the light-emitting layer 220. The first functional layer may include a hole injection layer (HIL) and a hole transport layer (HTL), and the second functional layer may include an electron transport layer (ETL) and an electron injection layer (EIL). The light-emitting layer 220 may include a low molecular weight material or a polymer material, and emit red, green, blue, or white light.

The counter electrode 230 may be located on the light-emitting layer 220. The counter electrode 230 may include a conductive material having a low work function. For example, the counter electrode 230 may include a (semi-) transparent layer including Ag, Mg, Al, Pt, Pd, Au, Ni, Nd, Ir, Cr, lithium (Li), calcium (Ca), an alloy thereof, or the like. Alternatively, the counter electrode 230 may further include a layer, such as ITO, IZO, ZnO, or $In_2O_3$ on the (semi-) transparent layer including the material described above.

Figure 4:
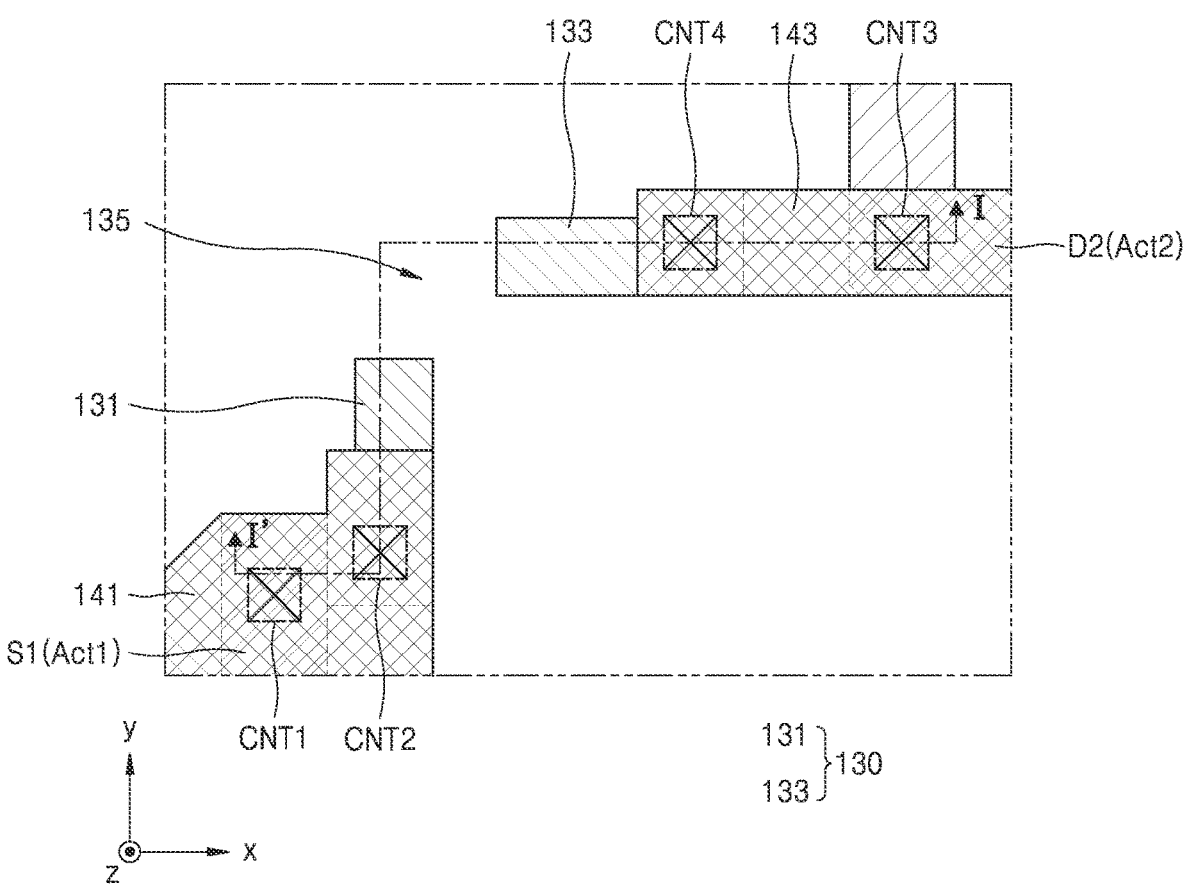
FIG. 4 is a schematic plan view of a display apparatus according to some embodiments.
Figure 5:
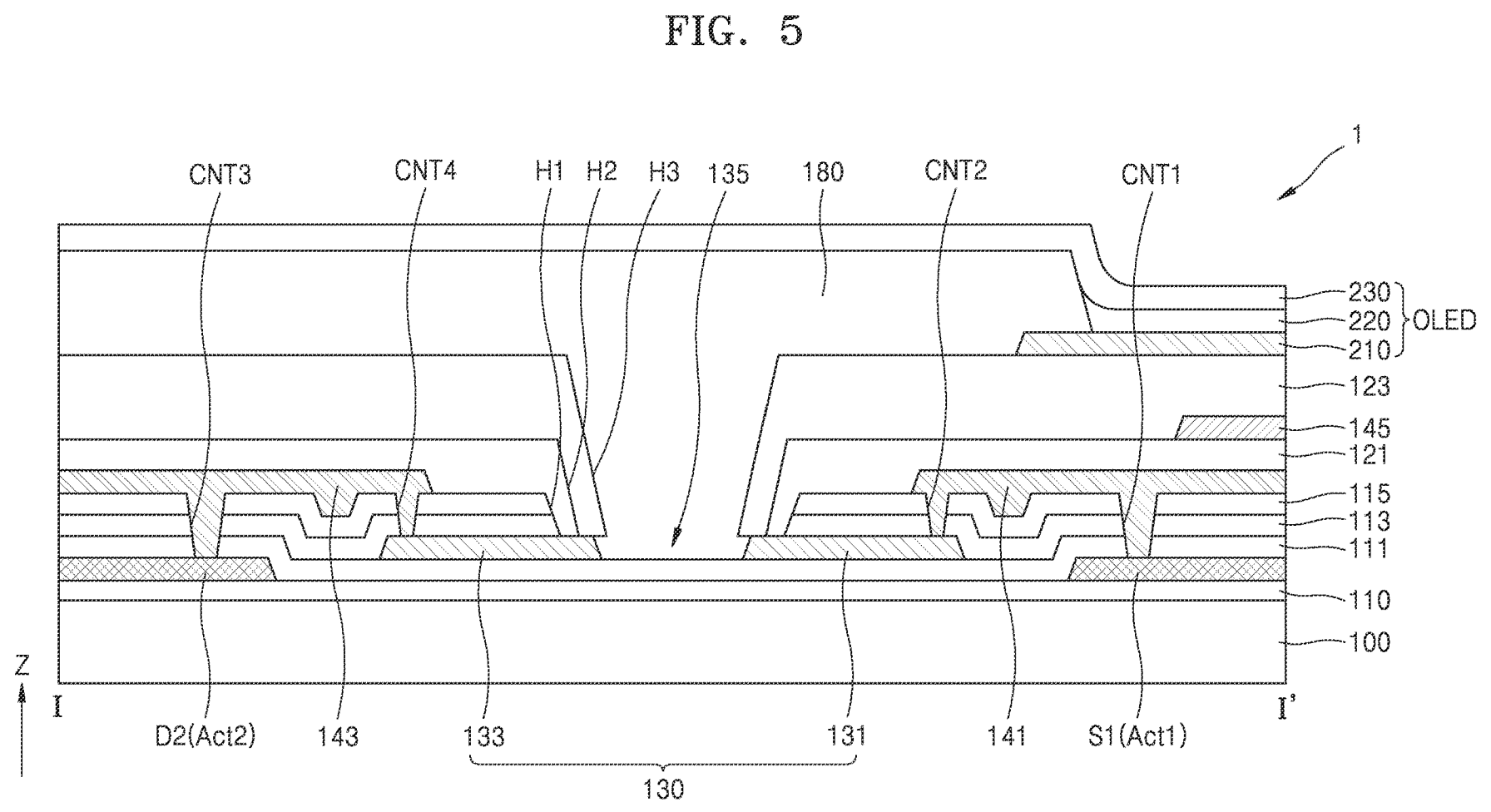

FIG. 4 is a schematic plan view of a display apparatus according to some embodiments, and FIG. 5 is a schematic cross-sectional view of a display apparatus according to some embodiments. In FIG. 4, aspects of some elements may be omitted for convenience of explanation and illustration. FIG. 5 corresponds to a cross-sectional view taken along line I-I' of FIG. 4. In FIG. 5, the same reference numerals as those of FIG. 3 denote the same elements, and thus, some redundant descriptions thereof may be omitted.

Referring to FIGS. 4 and 5, the display apparatus 1 may include a connection line 130 and a disconnection portion 135. The connection line 130 may include a first connection line 131 and a second connection line 133. The disconnection portion 135 may be defined between the first connection line 131 and the second connection line 133.

The buffer layer 110 may be located on the substrate 100, and the first semiconductor layer Act1 of the first transistor T1 (see FIG. 3) and the second semiconductor layer Act2 of the second transistor T2 (see FIG. 3) may be located on the buffer layer 110. For example, the first source S1 of the first transistor T1 and the second drain D2 of the second transistor T2 may be located on the buffer layer 110.

The first insulating layer 111 may be located on the first semiconductor layer Act1 and the second semiconductor layer Act2, and the connection line 130 may be located on the first insulating layer 111. As described above, the connection line 130 may include the first connection line 131 and the second connection line 133. In other words, the first connection line 131 and the second connection line 133 may be located on the first insulating layer 111. The first connection line 131 and the second connection line 133 may be formed on the same layer and may include the same material. The first connection line 131 and the second connection line 133 may be formed on the same layer as and may include the same material as the first gate electrode GE1 (see FIG. 3) described above in FIG. 3.

According to some embodiments, in a plan view, the first connection line 131 may have a shape protruding in a first direction (e.g., a y direction) with respect to the second contact hole CNT2. Furthermore, in a plan view, the second connection line 133 may have a shape protruding in a second direction (e.g., an x direction) crossing the first direction (e.g., the y direction) with respect to a fourth contact hole CNT4. In other words, in a plan view, the first connection line 131 may have a protruding portion protruding in the first direction (e.g., the y direction) with respect to the second contact hole CNT2, and the second connection line 133 may have a protruding portion protruding in the second direction (e.g., the x direction) with respect to the fourth contact hole CNT4.

According to some embodiments, the display apparatus 1 may include the disconnection portion 135. The disconnection portion 135 may be defined between the first connection line 131 and the second connection line 133. The disconnection portion 135 may disconnect the first connection line 131 and the second connection line 133 from each other. Accordingly, the first connection line 131 and the second connection line 133 may not be electrically connected to each other. As the disconnection portion 135 is defined between the first connection line 131 and the second connection line 133, at least a portion of the upper surface of the first insulating layer 111 may be exposed.

According to some embodiments, the second insulating layer 113 may be located on the connection line 130, and the third insulating layer 115 may be located on the second insulating layer 113. For example, the second insulating layer 113 and the third insulating layer 115 may be located on the first connection line 131 and the second connection line 133.

According to some embodiments, a first hole H1 corresponding to the disconnection portion 135 may be defined in the second insulating layer 113 and the third insulating layer 115. The first hole H1 defined in the second insulating layer 113 and the third insulating layer 115 may at least partially overlap the disconnection portion 135. For example, when viewed from the thickness direction (e.g., in a plan view, or when viewed from the third direction (z direction)) of the substrate 100, the first hole H1 defined in the second insulating layer 113 and the third insulating layer 115 may at least partially overlap the disconnection portion 135.

According to some embodiments, a first line 141 and a second line 143 may be located on the third insulating layer 115. The first line 141 and the second line 143 may be formed on the same layer as and may include the same material as the first source electrode SE1 (see FIG. 3) described above in FIG. 3. For example, the first line 141 may correspond to a portion of the first source electrode SE1, and the second line 143 may correspond to a portion of the second drain electrode DE2 (see FIG. 3).

According to some embodiments, the first line 141 may electrically connect the first semiconductor layer Act1 with the first connection line 131. For example, the first line 141 may electrically connect the first source S1 of the first semiconductor layer Act1 with the first connection line 131. As described above in FIG. 3, as the first transistor T1 (see FIG. 3) includes the first semiconductor layer Act1, it may be understood that the first line 141 electrically connects the first transistor T1 with the first connection line 131. Thus, the first line 141 may electrically connect the first source S1 of the first transistor T1 with the first connection line 131. For example, one side of the first line 141 may be electrically connected to the first source S1 of the first transistor T1 via a he first contact hole CNT1 defined in the first insulating layer 111, the second insulating layer 113, and the third insulating layer 115, whereas the other side of the first line 141 may be electrically connected to the first connection line 131 via the second contact hole CNT2 defined in the second insulating layer 113 and the third insulating layer 115.

According to some embodiments, the second line 143 may electrically connect the second semiconductor layer Act2 with the second connection line 133. For example, the second line 143 may electrically connect the second drain D2 of the second semiconductor layer Act2 with the second connection line 133. As described above in FIG. 3, as the second transistor T2 (see FIG. 3) includes the second semiconductor layer Act2, it may be understood that the second line 143 electrically connects the second transistor T2 with the second connection line 133. Thus, the second line 143 may electrically connect the second drain D2 of the second transistor T2 with the second connection line 133. For example, one side of the second line 143 may be electrically connected to the second drain D2 of the second transistor T2 via a third contact hole CNT3 defined in the first insulating layer 111, the second insulating layer 113, and the third insulating layer 115, whereas the other side of the second line 143 may be electrically connected to the second connection line 133 via the fourth contact hole CNT4 defined in the second insulating layer 113 and the third insulating layer 115.

According to some embodiments, although the first source S1 of the first transistor T1 and the first connection line 131 are electrically connected to each other through the first line 141, and the second drain D2 of the second transistor T2 and the second connection line 133 are electrically connected to each other through the second line 143, as the disconnection portion 135 is defined between the first connection line 131 and the second connection line 133, a DC current path may not be formed between the first source S1 of the first transistor T1 and the second drain D2 of the second transistor T2. In other words, the DC current path may not be formed between the first transistor T1 and the second transistor T2. This will be described below in more detail.

According to some embodiments, the first organic insulating layer 121 may be located the first line 141 and the second line 143. A second hole H2 corresponding to the disconnection portion 135 may be defined in the first organic insulating layer 121. The second hole H2 defined in the first organic insulating layer 121 may at least partially overlap the disconnection portion 135. For example, when viewed from the thickness direction (e.g., in a plan view) of the substrate 100, the second hole H2 defined in the first organic insulating layer 121 may at least partially overlap the disconnection portion 135.

According to some embodiments, the first hole H1 and the second hole H2 may at least partially overlap each other. The width of (or width across) the first hole H1 may be greater than the width of (or width across) the second hole H2. For example, in a plan view, the width of (or width across) the first hole H1 may be greater than the width of (or width across) the second hole H2. The first organic insulating layer 121 may cover the side surfaces of the second insulating layer 113 and the third insulating layer 115.

According to some embodiments, a third line 145 may be located on the first organic insulating layer 121. The third line 145 may be formed on the same layer as and may include the same material as the connection electrode CM (see FIG. 3).

According to some embodiments, the second organic insulating layer 123 may be located on the third line 145. A third hole H3 corresponding to the disconnection portion 135 may be defined in the second organic insulating layer 123. The third hole H3 defined in the second organic insulating layer 123 may at least partially overlap the disconnection portion 135. For example, when viewed from the thickness direction (e.g., in a plan view) of the substrate 100, the third hole H3 defined in the second organic insulating layer 123 may at least partially overlap the disconnection portion 135.

According to some embodiments, the second hole H2 and the third hole H3 may at least partially overlap each other. The width of (or width across) the second hole H2 may be greater than the width of (or width across) the third hole H3. For example, in a plan view, the width of (or width across) the second hole H2 may be greater than the width of (or width across) the third hole H3. The second organic insulating layer 123 may cover the side surface of the first organic insulating layer 121.

According to some embodiments, the pixel electrode 210 may be located on the second organic insulating layer 123. The pixel electrode 210 may not overlap the disconnection portion 135. For example, when viewed from the thickness direction (e.g., in a plan view) of the substrate 100, the pixel electrode 210 and the disconnection portion 135 may not overlap each other. Furthermore, the pixel electrode 210 may not overlap the first hole H1, the second hole H2, and the third hole H3. The pixel electrode 210 may not overlap the connection line 130. However, embodiments according to the present disclosure are not limited thereto. The pixel electrode 210 may overlap (or at least partially overlap) the connection line 130. However, even in this case, the pixel electrode 210 may not overlap the disconnection portion 135.

According to some embodiments, the pixel defining layer 180 may be located on the pixel electrode 210 and the second organic insulating layer 123. At least a portion of the pixel defining layer 180 may be located on the disconnection portion 135. The pixel defining layer 180 may be located within the third hole H3. For example, the pixel defining layer 180 may cover the side surface of the second organic insulating layer 123. The pixel defining layer 180 may be in direct contact with the connection line 130. For example, the pixel defining layer 180 may be in direct contact with the first connection line 131 and the second connection line 133.

Figure 6:
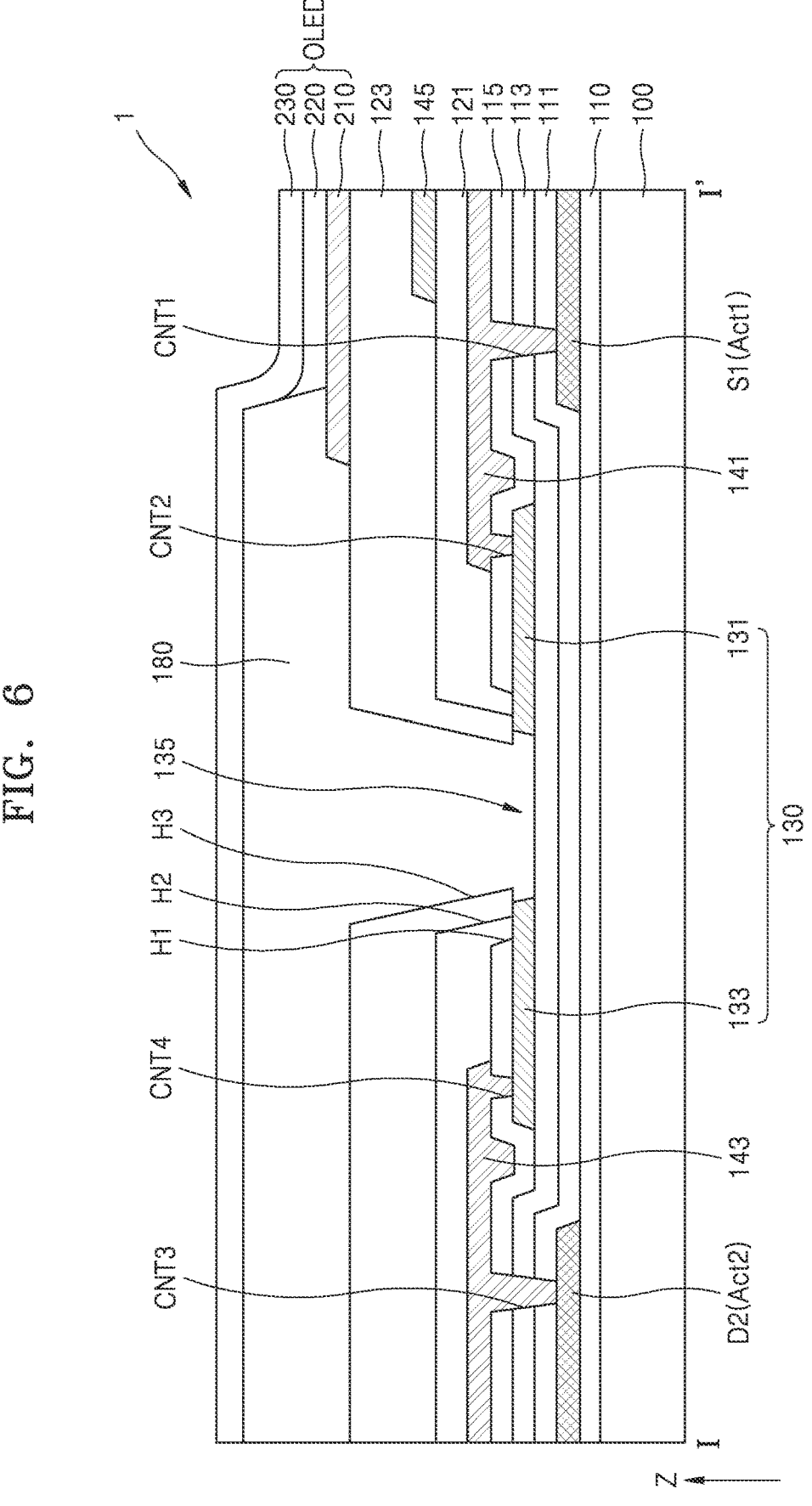
FIG. 6 is a schematic cross-sectional view of a display apparatus according to some embodiments.

FIG. 6 is a schematic cross-sectional view of a display apparatus according to some embodiments. The embodiments illustrated and described with respect to FIG. 6 are different from the embodiments illustrated and described with respect to FIG. 5 in that the connection line 130 may be located on the second insulating layer 113. In FIG. 6, as the same reference numerals as those of FIG. 5 denote the same elements, and some redundant descriptions thereof may be omitted.

Referring to FIG. 6, the connection line 130 may be located on the second insulating layer 113. In other words, the first connection line 131 and the second connection line 133 may be located on the second insulating layer 113. The first connection line 131 and the second connection line 133 may be formed on the same layer and may include the same material. The first connection line 131 and the second connection line 133 may be formed on the same layer as and may include the same material as the first upper electrode CE2 (see FIG. 3) described above in FIG. 3.

According to some embodiments, the display apparatus 1 may include the disconnection portion 135. The disconnection portion 135 may be defined between the first connection line 131 and the second connection line 133. The disconnection portion 135 may disconnect the first connection line 131 and the second connection line 133 from each other. Accordingly, the first connection line 131 and the second connection line 133 may not be electrically connected to each other. As the disconnection portion 135 is defined between the first connection line 131 and the second connection line 133, at least a portion of the upper surface of the second insulating layer 113 may be exposed.

FIGS. 7 to 13 are schematic cross-sectional views of a method of manufacturing a display apparatus, according to some embodiments.

Referring to FIGS. 7 to 13, a method of manufacturing a display apparatus may include forming, on the substrate 100, the pixel circuit PC (see FIG. 3) including the first transistor T1 (see FIG. 3) and the second transistor T2 (see FIG. 3) and the connection line 130 connecting the first transistor T1 with the second transistor T2, performing an array test on the pixel circuit PC, and disconnecting the connection line 130.

Furthermore, the forming of the pixel circuit PC including the first transistor T1 and the second transistor T2 and the connection line 130 connecting the first transistor T1 with the second transistor T2, on the substrate 100, may include forming, on the substrate 100, the first semiconductor layer Act1 and the second semiconductor layer Act2, forming the first insulating layer 111 on the first semiconductor layer Act1 and the second semiconductor layer Act2, forming the connection line 130 on the first insulating layer 111, forming, on the connection line 130, the second insulating layer 113 in which the first hole H1 for exposing at least a portion of the connection line 130 is defined, forming the first line 141 and the second line 143 on the second insulating layer 113, forming, on the first line 141 and the second line 143, the first organic insulating layer 121 in which the second hole H2 for exposing at least a portion of the connection line 130 is defined, and forming the third line 145 on the first organic insulating layer 121.

Furthermore, after the forming of the third line 145, the forming of the pixel circuit PC further included are forming, on the third line 145, the second organic insulating layer 123 in which the third hole H3 for exposing at least a portion of the connection line 130 is defined, and forming a pattern material 210M on the connection line 130 and the second organic insulating layer 123.

Figure 7:
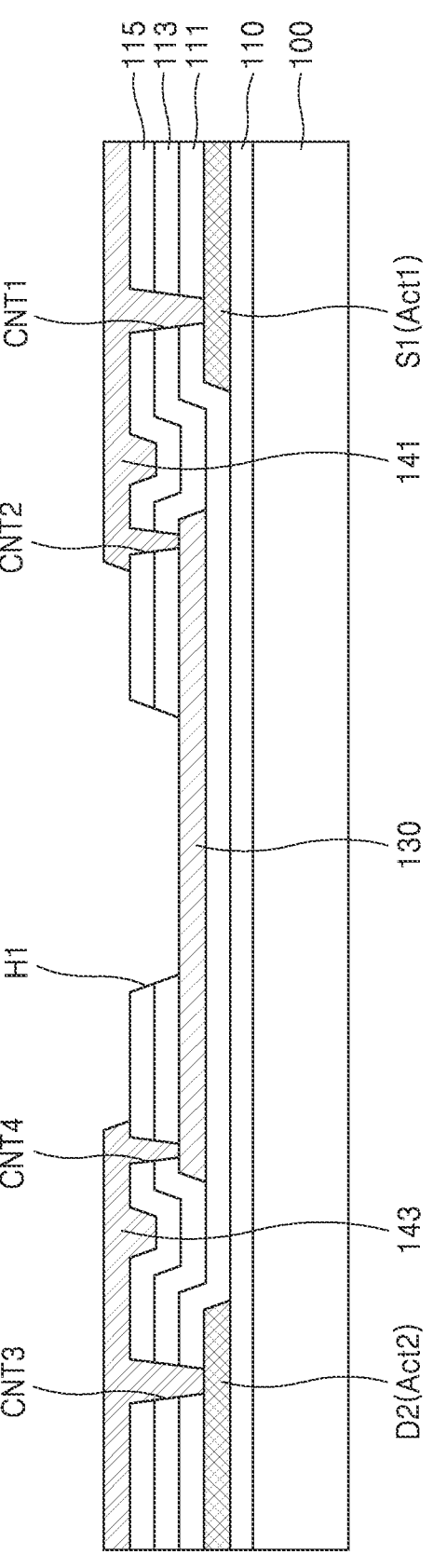
FIGS. 7 to 13 are schematic cross-sectional views of a method of manufacturing a display apparatus, according to some embodiments.

Referring to FIG. 7, the buffer layer 110 may be formed on the substrate 100, and the first semiconductor layer Act1 and the second semiconductor layer Act2 may be formed on the buffer layer 110. Furthermore, the first insulating layer 111 may be formed on the first semiconductor layer Act1 and the second semiconductor layer Act2. The first insulating layer 111 may cover the first semiconductor layer Act1 and the second semiconductor layer Act2.

The connection line 130 may be formed on the first insulating layer 111. The connection line 130 may not overlap the first semiconductor layer Act1 and the second semiconductor layer Act2. According to some embodiments, the first gate electrode GE1 (see FIG. 3), the second gate electrode GE2 (see FIG. 3), the first lower electrode CE1 (see FIG. 3), and the second lower electrode CE3 (see FIG. 3), which are described above in FIG. 3, may be formed on the first insulating layer 111. In other words, the connection line 130, the first gate electrode GE1, the second gate electrode GE2, the first lower electrode CE1, and the second lower electrode CE3 may be formed in the same process. The connection line 130, the first gate electrode GE1, the second gate electrode GE2, the first lower electrode CE1, and the second lower electrode CE3 may be formed on the same layer and may include the same material.

Furthermore, after forming, on the first insulating layer 111, the connection line 130, the first gate electrode GE1, the second gate electrode GE2, the first lower electrode CE1, and the second lower electrode CE3, impurities (or ions) may be injected into at least a portion of the first semiconductor layer Act1 and the second semiconductor layer Act2. Accordingly, the first semiconductor layer Act1 may include the first source S1, the first channel C1 (see FIG. 3), and the first drain D1 (see FIG. 3), whereas the second semiconductor layer Act2 may include the second source S2 (see FIG. 3), the second channel C2 (see FIG. 3), and the second drain D2.

The second insulating layer 113 may be formed on the connection line 130, and the third insulating layer 115 may be formed on the second insulating layer 113. According to some embodiments, after forming the second insulating layer 113 on the connection line 130, the first upper electrode CE2 (see FIG. 3) and the second upper electrode CE4 (see FIG. 3), which are described above in FIG. 3, may be formed on the second insulating layer 113. In other words, a process of forming the first upper electrode CE2 and the second upper electrode CE4 may be performed between a process of forming the second insulating layer 113 and a process of forming the third insulating layer 115. As described above in FIG. 3, while the first upper electrode CE2 is insulated from the first lower electrode CE1, the first upper electrode CE2 and the first lower electrode CE1 may at least partially overlap each other. The first upper electrode CE2 and the first lower electrode CE1 may form the first capacitor Cst1. As described above in FIG. 3, while the second upper electrode CE4 is insulated from the second lower electrode CE3, the second upper electrode CE4 and the second lower electrode CE3 may at least partially overlap each other. The second upper electrode CE4 and the second lower electrode CE3 may form the second capacitor Cst2.

According to some embodiments, the connection line 130 may be formed on the second insulating layer 113. In this case, the connection line 130 may be formed in the same process with the first upper electrode CE2 and the second upper electrode CE4. For example, the connection line 130, the first upper electrode CE2, and the second upper electrode CE4 may be formed on the same layer and may include the same material.

According to some embodiments, the first hole H1 may be formed in (or through) the second insulating layer 113 and the third insulating layer 115. For example, the first hole H1 may be formed by partially removing the second insulating layer 113 and the third insulating layer 115. At least a portion of the connection line 130 may be exposed through the first hole H1 defined in the second insulating layer 113 and the third insulating layer 115. In this state, as portions of the second insulating layer 113 and the third insulating layer 115 are removed, at least a portion of the connection line 130 may be removed together. In this case, the thickness of the connection line 130 at least a portion of which is exposed may be less than the thickness of the connection line 130 located below the second insulating layer 113.

Furthermore, the second contact hole CNT2 and the fourth contact hole CNT4 may be defined in the second insulating layer 113 and the third insulating layer 115, whereas the first contact hole CNT1 and the third contact hole CNT3 may be defined in the first insulating layer 111, the second insulating layer 113, and the third insulating layer 115.

The first line 141 and the second line 143 may be formed on the third insulating layer 115. According to some embodiments, the first source electrode SE1 (see FIG. 3), the first drain electrode DE1 (see FIG. 3), the second source electrode SE2 (see FIG. 3), and the second drain electrode DE2 (see FIG. 3), which are described above in FIG. 3, may be formed on the third insulating layer 115. In other words, the first line 141 and the second line 143 may be formed in the same process as the first source electrode SE1, the first drain electrode DE1, the second source electrode SE2, and the second drain electrode DE2. Accordingly, the first line 141, the second line 143, the first source electrode SE1, the first drain electrode DE1, the second source electrode SE2, and the second drain electrode DE2 may be formed on the same layer and may include the same material.

According to some embodiments, the first semiconductor layer Act1 and the connection line 130 may be electrically connected to each other through the first line 141. The first semiconductor layer Act1 and the first line 141 may be electrically connected to each other through first contact hole CNT1, and the first line 141 and the connection line 130 may be electrically connected to each other through the second contact hole CNT2. Accordingly, the first semiconductor layer Act1 and the connection line 130 may be electrically connected to each other. For example, the first source S1 of the first semiconductor layer Act1 and the connection line 130 may be electrically connected to each other through the first line 141. As described above in FIG. 3, as the first transistor T1 (see FIG. 3) includes the first semiconductor layer Act1, it may be understood that the first transistor T1 and the connection line 130 are electrically connected to each other. Thus, the first source S1 of the first transistor T1 and the connection line 130 may be electrically connected to each other.

According to some embodiments, the second semiconductor layer Act2 and the connection line 130 may be electrically connected to each other through the second line 143. The second semiconductor layer Act2 and the second line 143 may be electrically connected to each other through the third contact hole CNT3, whereas the second line 143 and the connection line 130 may be electrically connected to each other through the fourth contact hole CNT4. Accordingly, the second semiconductor layer Act2 and the connection line 130 may be electrically connected to each other. For example, the second drain D2 of the second semiconductor layer Act2 and the connection line 130 may be electrically connected to each other through the second line 143. As described above in FIG. 3, as the second transistor T2 (see FIG. 3) includes the second semiconductor layer Act2, it may be understood that the second transistor T2 and the connection line 130 are electrically connected to each other. Thus, the second drain D2 of the second transistor T2 and the connection line 130 may be electrically connected to each other.

According to some embodiments, as the first semiconductor layer Act1 and the connection line 130 are electrically connected to each other, and the second semiconductor layer Act2 and the connection line 130 are electrically connected to each other, the first semiconductor layer Act1 and the second semiconductor layer Act2 may be electrically connected to each other. For example, the first source S1 of the first semiconductor layer Act1 and the second drain D2 of the second semiconductor layer Act2 may be electrically connected to each other. Accordingly, the DC current path may be formed between the first source S1 of the first semiconductor layer Act1 and the second drain D2 of the second semiconductor layer Act2. In other words, the DC current path may be formed between the first transistor T1 and the second transistor T2. For example, the DC current path may be formed between the first source S1 of the first transistor T1 and the second drain D2 of the second transistor T2. This will be described below in more detail.

Figure 8:
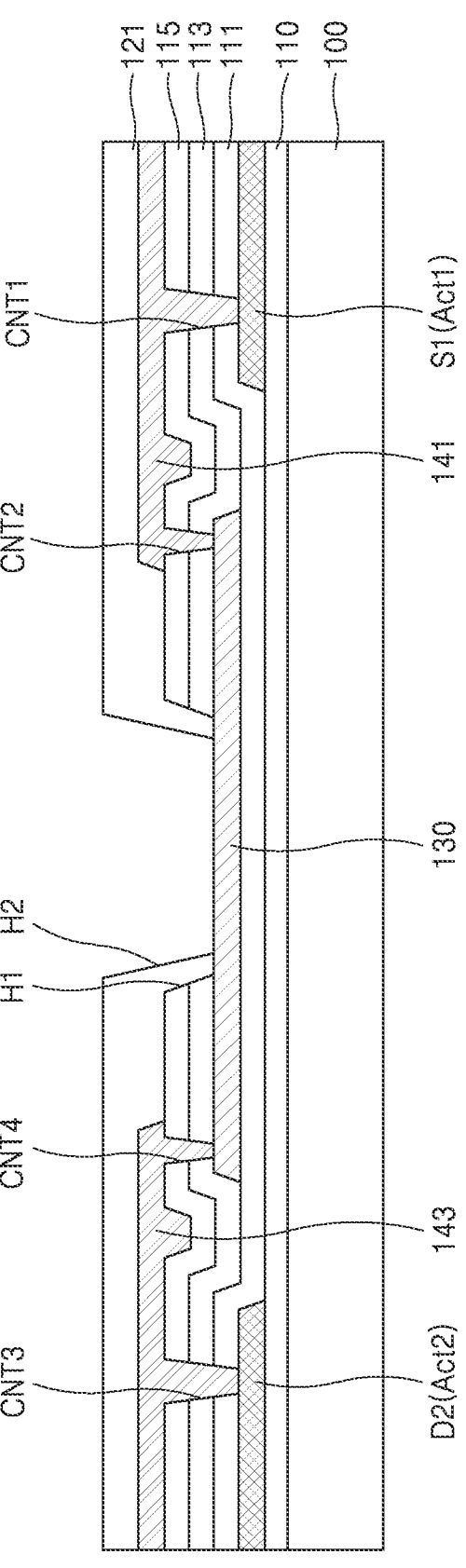

Referring to FIG. 8, the first organic insulating layer 121 in which the second hole H2 for exposing at least a portion of the connection line 130 is defined may be formed on the first line 141 and the second line 143.

According to some embodiments, at least a portion of the connection line 130 may be exposed through the second hole H2 defined in the first organic insulating layer 121.

According to some embodiments, the second hole H2 may overlap the first hole H1. The width of (or width across) the first hole H1 may be greater than the width of (or width across) the second hole H2. For example, in a plan view, the width of (or width across) the first hole H1 may be greater than the width of (or width across) the second hole H2. The first organic insulating layer 121 may cover the side surfaces of the second insulating layer 113 and the third insulating layer 115.

Figure 9:
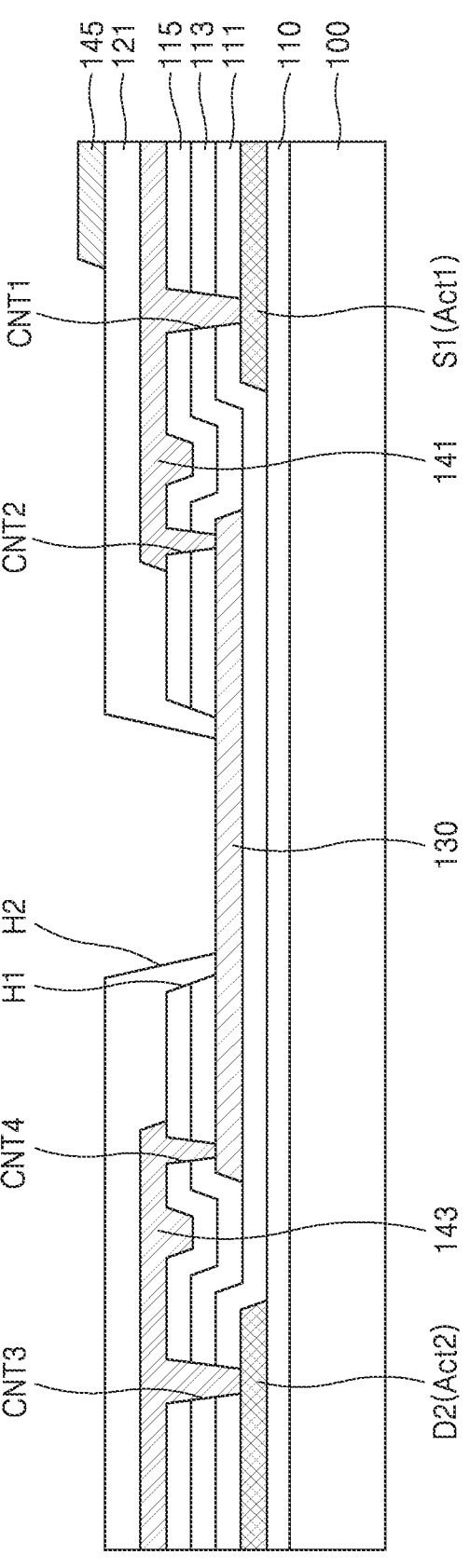

Referring to FIG. 9, the third line 145 may be formed on the first organic insulating layer 121. According to some embodiments, the connection electrode CM (see FIG. 3) described above in FIG. 3 may be formed on the first organic insulating layer 121. In other words, the third line 145 and the connection electrode CM may be formed in the same process. The third line 145 and the connection electrode CM may be formed on the same layer and may include the same material.

According to some embodiments, after the third line 145 is formed on the first organic insulating layer 121, an array test may be performed on the pixel circuit PC (see FIG. 2). The array test may be performed to detect poor electrical properties of wires and/or transistors. In this state, the array test may be performed by a typical method. For example, defects of wires and/or transistors may be detected by inspecting electrical properties of transistors by using array test equipment. This will be described below in more detail.

Figure 10:
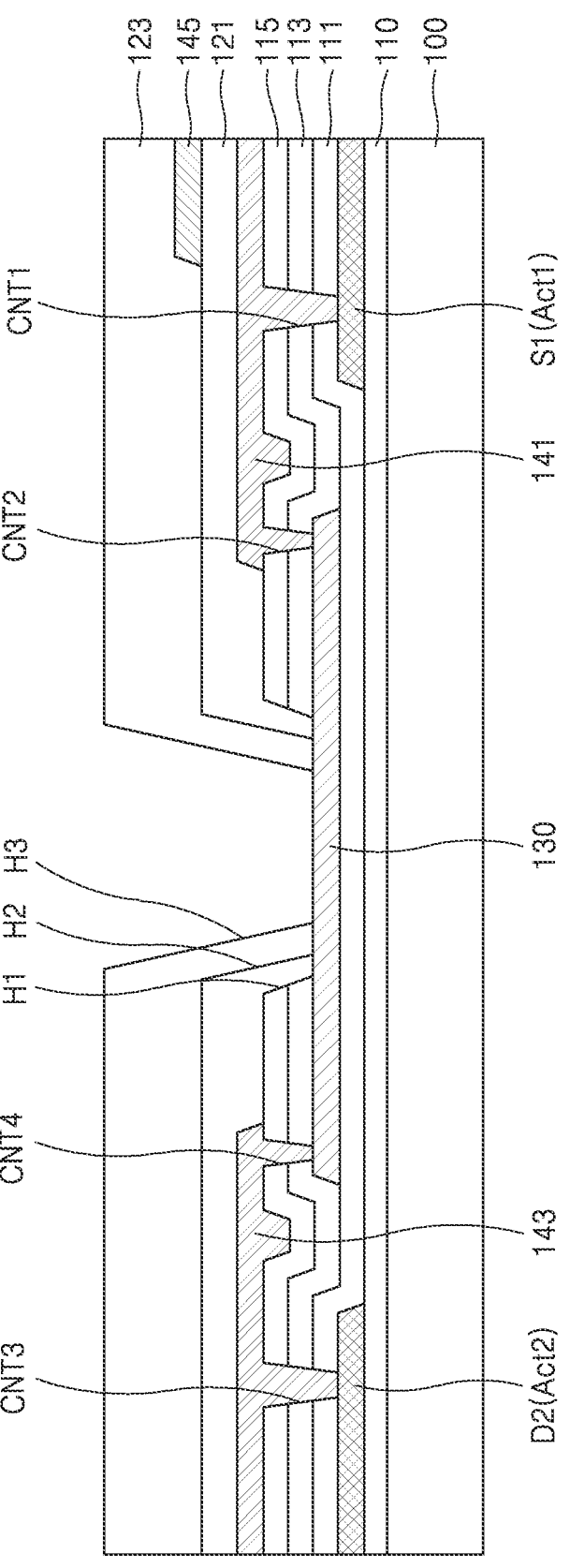

Referring to FIG. 10, the second organic insulating layer 123 in which the third hole H3 for exposing at least a portion of the connection line 130 is defined may be formed on the third line 145.

According to some embodiments, at least a portion of the connection line 130 may be exposed through the third hole H3 defined in the second organic insulating layer 123.

According to some embodiments, the third hole H3 may overlap the second hole H2. The width of (or width across) the second hole H2 may be greater than the width of (or width across) the third hole H3. For example, in a plan view, the width of (or width across) the second hole H2 may be greater than the width of (or width across) the third hole H3. The second organic insulating layer 123 may cover the side surface of the first organic insulating layer 121.

Figure 11:
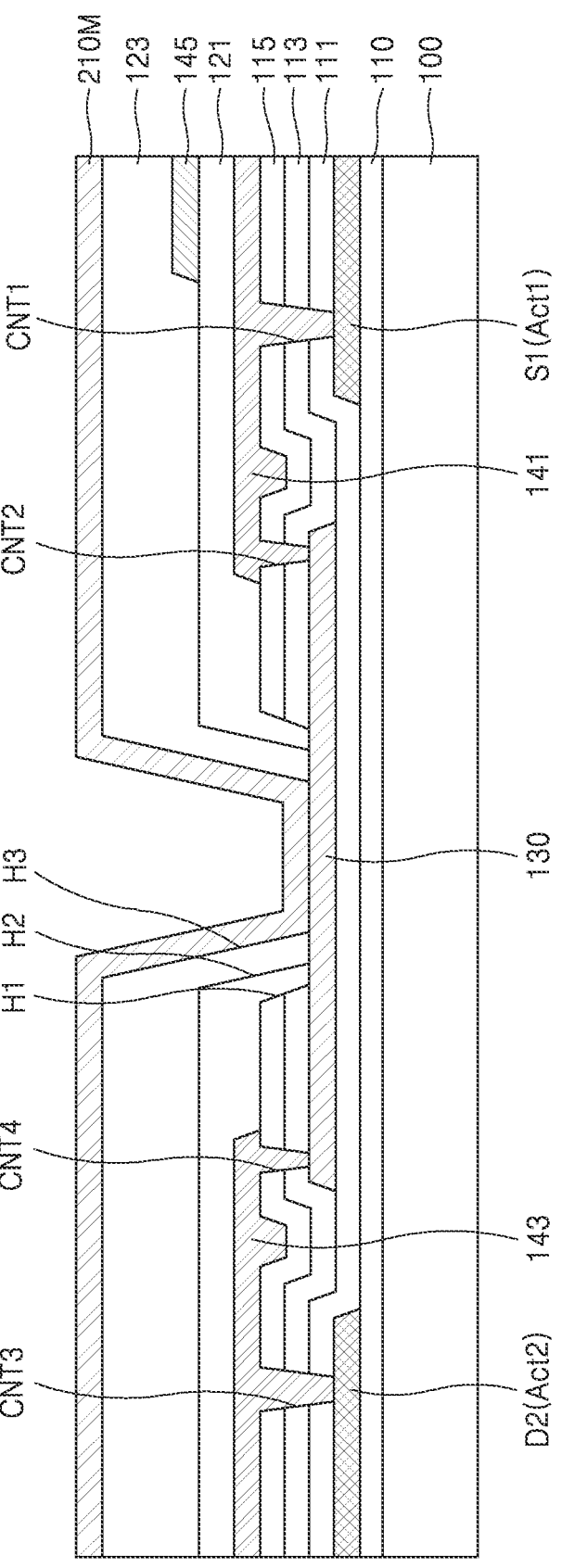

Referring to FIG. 11, the pattern material 210M may be coated on the connection line 130 and the second organic insulating layer 123. The pattern material 210M may be entirely formed on the connection line 130 and the second organic insulating layer 123.

The pattern material 210M may include a conductive oxide, such as ITO, IZO, ZnO, $in_2O_3$, IGO, or AZO. Alternatively, the pattern material 210M may include a reflective film including Ag, Mg, Al, Pt, Pd, Au, Ni, Nd, Ir, Cr, or a compound thereof. Alternatively, the pattern material 210M may further include a film formed of ITO, IZO, ZnO, or $In_2O_3$ located above/below the reflective film described above.

Figure 12:
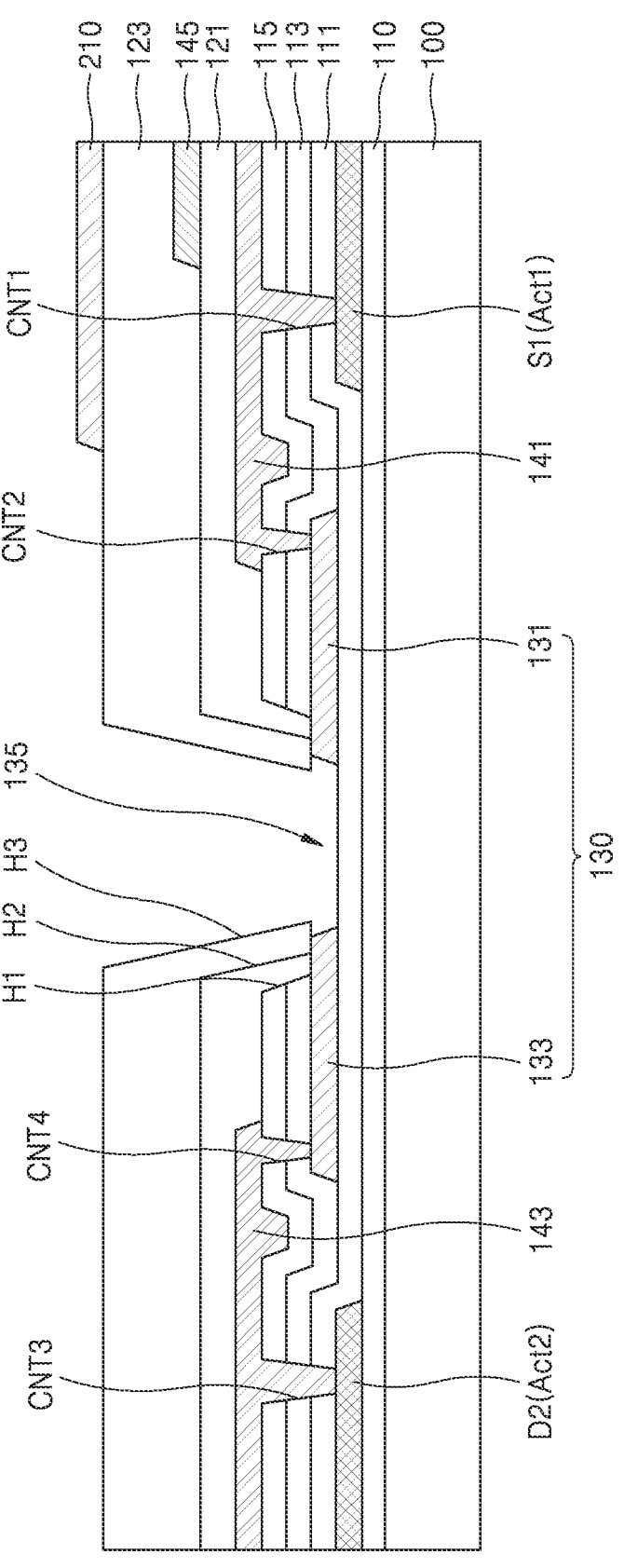

Referring to FIG. 12, the pixel electrode 210 may be formed by etching the pattern material 210M. When the pattern material 210M is etched, at least a portion of the connection line 130 is etched together so that the connection line 130 may be disconnected.

For example, as the pattern material 210M is etched, the pixel electrode 210 may be formed, and in this state, at least a portion of the connection line 130 is etched together so that the connection line 130 may be divided into the first connection line 131 and the second connection line 133, and the disconnection portion 135 may be formed between the first connection line 131 and the second connection line 133. For example, when the pixel electrode 210 is formed by etching the pattern material 210M, at least a portion of the connection line 130 that is exposed through the third hole H3 defined in the second organic insulating layer 123 is etched together so that the connection line 130 may be divided into the first connection line 131 and the second connection line 133, and the disconnection portion 135 may be formed between the first connection line 131 and the second connection line 133.

The disconnection portion 135 may be formed between the first connection line 131 and the second connection line 133. At least a portion of the upper surface of the first insulating layer 111 may be exposed through the disconnection portion 135. As the disconnection portion 135 is formed between the first connection line 131 and the second connection line 133, the first connection line 131 and the second connection line 133 may not be connected to each other. In other words, as the disconnection portion 135 is formed between the first connection line 131 and the second connection line 133, the first connection line 131 and the second connection line 133 may be severed (or short-circuited (broken), disconnected, separated, or spaced). Thus, the DC current path may not be formed between the first connection line 131 and the second connection line 133. The connection line 130 serves to provide the DC current path between the first source S1 of the first transistor T1 and the second drain D2 of the second transistor T2, as the connection line 130 is severed (or short-circuited (broken), disconnected, separated, or spaced) into the first connection line 131 and the second connection line 133, the DC current path may not be formed between the first source S1 of the first transistor T1 and the second drain D2 of the second transistor T2. In other words, the DC current path may not be formed between the first transistor T1 and the second transistor T2.

According to some embodiments, an undercut shape may be formed in the connection line 130. For example, an undercut shape may be formed in an end of the first connection line 131 adjacent to the disconnection portion 135 and an end of the second connection line 133 adjacent to the disconnection portion 135.

According to some embodiments, the pixel electrode 210 may not overlap the disconnection portion 135. For example, when viewed from the thickness direction of the substrate 100, the pixel electrode 210 and the disconnection portion 135 may not overlap each other. Furthermore, the pixel electrode 210 may not overlap the first hole H1, the second hole H2, and the third hole H3. The pixel electrode 210 may not overlap the connection line 130. However, embodiments according to the present disclosure are not limited thereto. The pixel electrode 210 may at least partially overlap the connection line 130.

Figure 13:
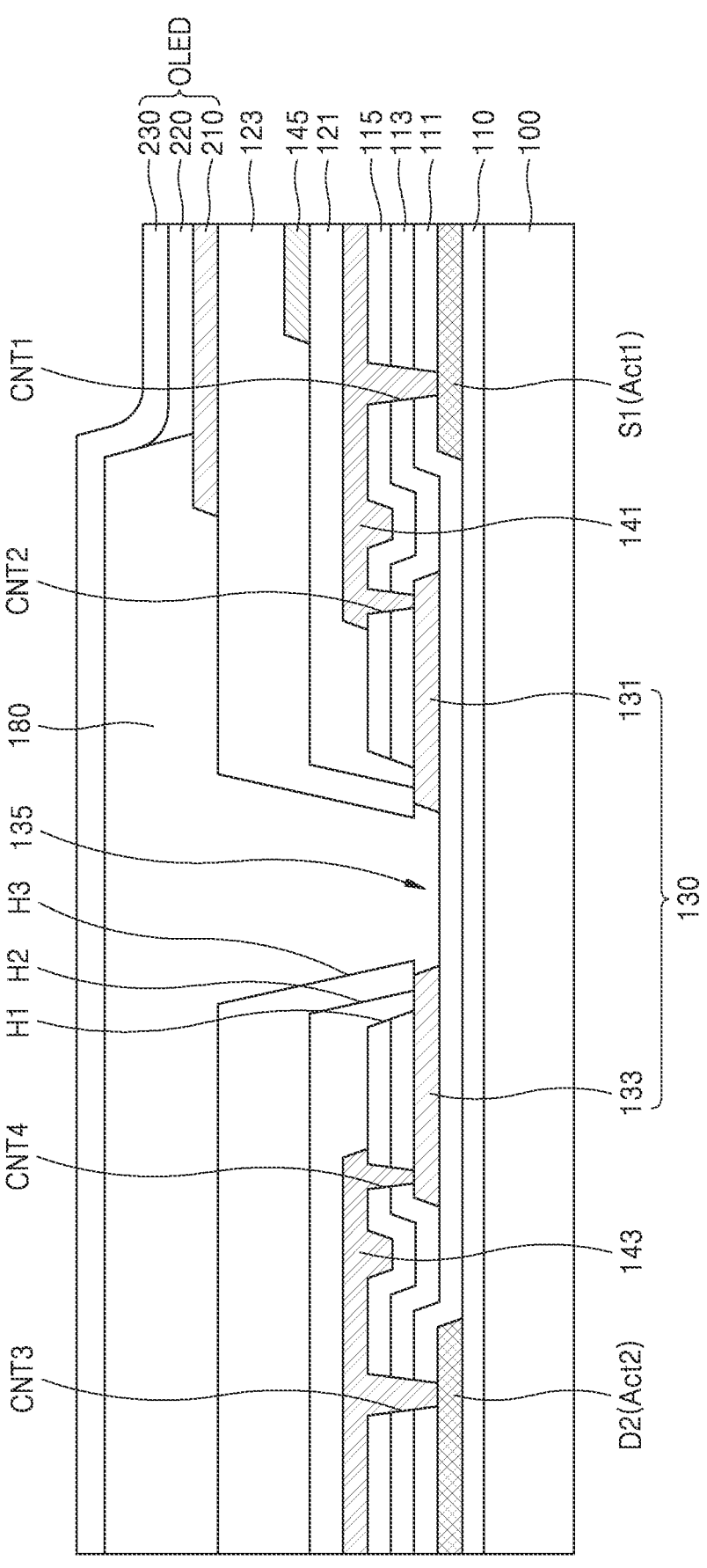

Referring to FIG. 13, the pixel defining layer 180 may be formed on the first insulating layer 111, the second organic insulating layer 123, and the pixel electrode 210. The pixel defining layer 180 may expose at least portion of the pixel electrode 210.

At least a portion of the pixel defining layer 180 may be formed on the disconnection portion 135. The pixel defining layer 180 may be formed within the third hole H3. For example, the pixel defining layer 180 may cover the side surface of the second organic insulating layer 123. The pixel defining layer 180 may be in direct contact with the connection line 130. For example, the pixel defining layer 180 may be in direct contact with the first connection line 131 and the second connection line 133. Furthermore, the pixel defining layer 180 may be formed directly on the upper surface of the first insulating layer 111. However, embodiments according to the present disclosure are not limited thereto. As described above FIG. 6, when the connection line 130 is formed on the second insulating layer 113, the pixel defining layer 180 may be formed (or in contact with) the upper surface of the second insulating layer 113.

According to some embodiments, the light-emitting layer 220 may be formed on the pixel electrode 210, and the counter electrode 230 may be formed on the light-emitting layer 220. The pixel electrode 210, the light-emitting layer 220, and the counter electrode 230 may form the organic light-emitting diode OLED.

Figure 14:
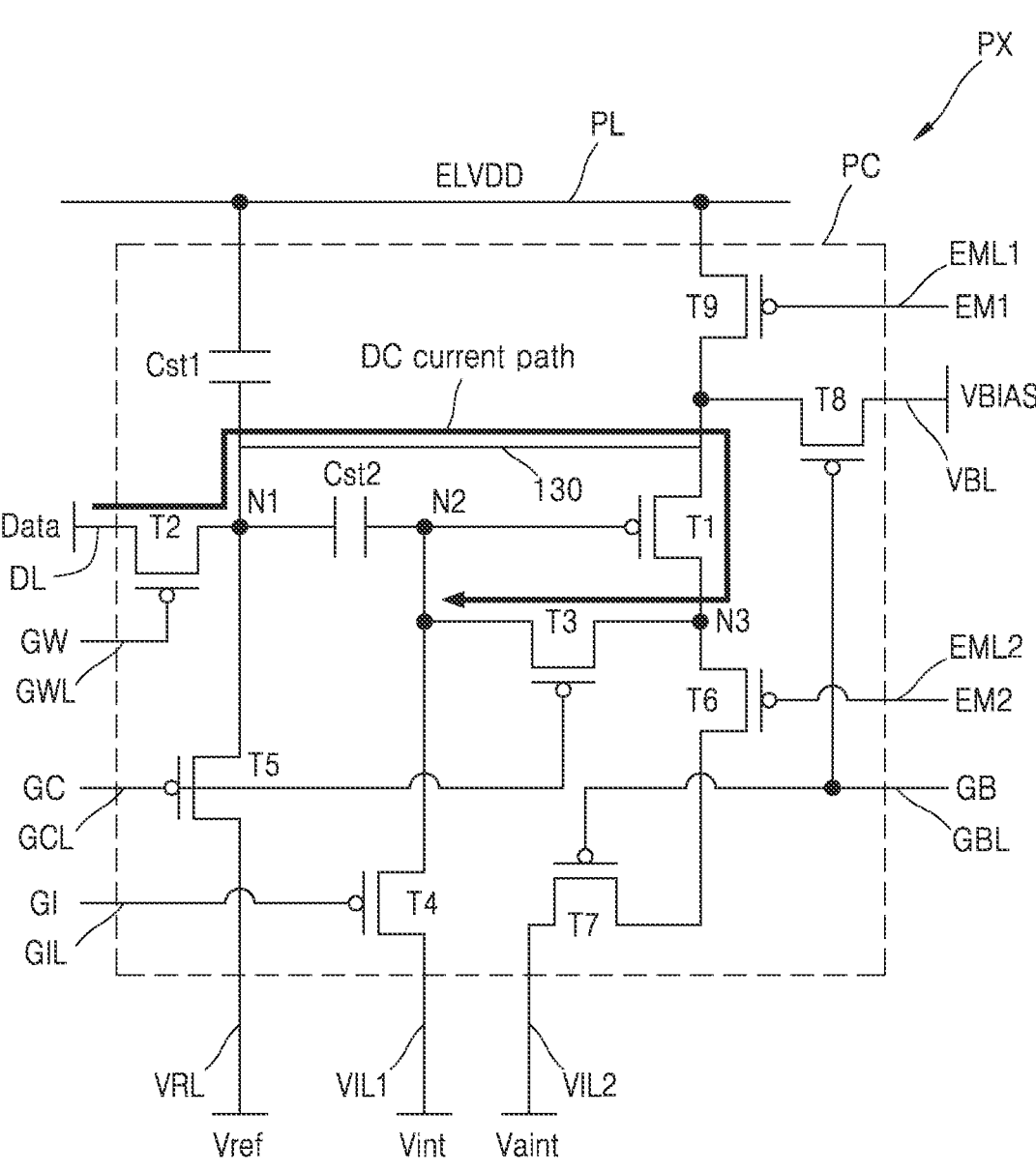
FIG. 14 is a schematic equivalent circuit diagram of a pixel circuit in a process of manufacturing a display apparatus, according to some embodiments.
Figure 15:
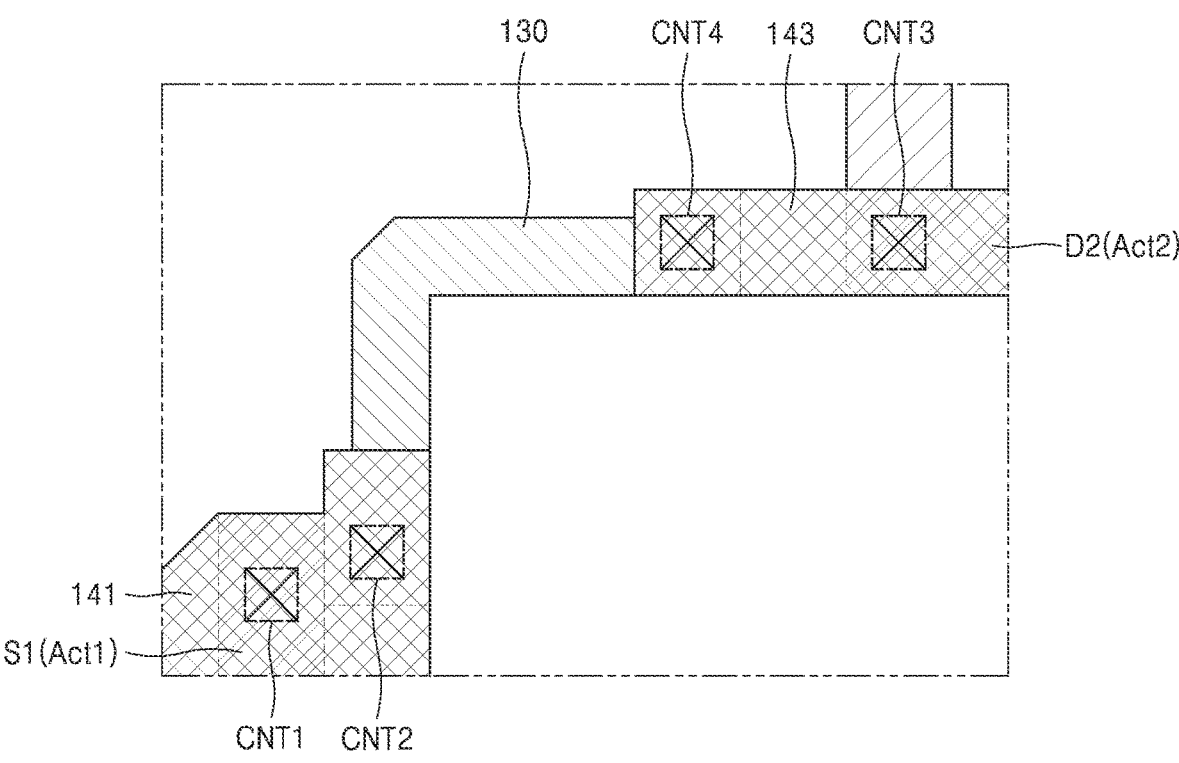
FIG. 15 is a schematic plan view of a display apparatus in the manufacturing process, according to some embodiments.

FIG. 14 is a schematic equivalent circuit diagram of a pixel circuit in a process of manufacturing a display apparatus, according to some embodiments, and FIG. 15 is a schematic plan view of a display apparatus in a manufacturing process, according to some embodiments. For example, FIGS. 14 and 15 are respectively an equivalent circuit diagram and a plan view of a pixel circuit in the operation of performing an array test. The equivalent circuit diagram and the plan view of the pixel circuit of FIGS. 14 and 15 may correspond to the cross-sectional view of FIG. 9.

As illustrated in FIG. 2, when a capacitor (e.g., the second capacitor Cst2) is located between the first node N1 and the second node N2, the DC current path is not formed between the first node N1 and the second node N2 so that there is a difficulty in performing an array test on the pixel circuit PC.

In other words, when the first transistor T1 and the second transistor T2 are not connected to each other through a line and/or a connection line, the DC current path does not exist between the first transistor T1 and the second transistor T2 so that there is a difficulty in performing an array test. In other words, there is a difficulty in detecting the poor electrical properties of wires and/or transistors formed on the substrate 100.

For example, while an array test may be performed because the DC current path exists along the data voltage (data or data signal), the second transistor T2, the fifth transistor T5, and the reference voltage Vref, there is a difficulty in performing an array test because an additional DC current path with the data voltage (data or data signal) does not exist due to the capacitor (e.g., the second capacitor Cst2) between the first node N1 and the second node N2. In other words, as the poor electrical properties of the first transistor T1, the third transistor T3, the fourth transistor T4, the sixth transistor T6, the seventh transistor T7, the eighth transistor T8, and the ninth transistor T9 are not detected in advance, a defect rate after manufacturing a display apparatus may increase so that a yield of a manufacturing process may be relatively lowered.

According to some embodiments, as the performing of an array test on the pixel circuit PC is made possible by using the connection line 130 formed on the first insulating layer 111 or the second insulating layer 113, the defect rate after manufacturing a display apparatus may be relatively reduced, and simultaneously, the yield of the manufacturing process may be relatively improved. For example, as illustrated in FIGS. 9, 14, and 15, the first source S1 of the first transistor T1 and the second drain D2 of the second transistor T2 may be electrically connected to each other through the connection line 130. As the first source S1 of the first transistor T1 and the second drain D2 of the second transistor T2 are electrically connected to each other, the DC current path may be formed between the first transistor T1 and the second transistor T2. As the DC current path is formed between the first transistor T1 and the second transistor T2, the data voltage (Data or data signal) is transmitted to the first transistor T1, and thus, an array test may be performed on the first transistor T1, the third transistor T3, the fourth transistor T4, the sixth transistor T6, the seventh transistor T7, the eighth transistor T8, and the ninth transistor T9. Accordingly, by enabling an array test of the pixel circuit PC through the connection line 130, the poor electrical properties of wires and/or transistors located on the substrate 100 may be detected in advance, and thus, the defect rate after manufacturing a display apparatus may be relatively reduced, and thus, the yield of the manufacturing process may be relatively improved.

By disconnecting the connection line 130 after performing an array test by using the connection line 130, additional transistor and/or additional signal wire for array test may not need to be located in the pixel circuit PC, a high-resolution display apparatus may be relatively easily implemented.

In other words, by disconnecting the connection line 130 after performing an array test on the pixel circuit PC, a high-resolution display apparatus may be implemented through nine transistors and two capacitors. For example, by forming, on the insulating layer, the connection line 130 connecting the first transistor T1 with the second transistor T2 and performing an array test through the connection line 130, without an additional separate process, by disconnecting the connection line 130 in the process of forming the pixel electrode 210, a defect rate is lowered so that the yield of the manufacturing process may be relatively improved, and thus, a high-resolution display apparatus may be provided through high-speed driving.

According to one or more embodiments configured as described above, by enabling an array test of a pixel circuit, a defect in the operation of a transistor may be detected in advance so that a display apparatus with relatively improved product reliability may be implemented. The scope of embodiments according to the present disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A method of manufacturing a display apparatus, the method comprising:
   forming, on a substrate, a pixel circuit including a first transistor and a second transistor and a connection line connecting the first transistor with the second transistor;
   performing an array test on the pixel circuit; and
   disconnecting the connection line by removing a portion of the connection line between the first transistor and the second transistor.

2. The method of claim 1, wherein the forming, on the substrate, a pixel circuit including a first transistor and a second transistor and a connection line connecting the first transistor with the second transistor comprises:
   forming, on the substrate, a first semiconductor layer and a second semiconductor layer;
   forming a first insulating layer on the first semiconductor layer and the second semiconductor layer;
   forming the connection line on the first insulating layer;
   forming a second insulating layer on the connection line, wherein a first hole exposing at least a portion of the connection line is defined in the second insulating layer;
   forming a first line and a second line on the second insulating layer;
   forming a first organic insulating layer on the first line and the second line, wherein a second hole exposing at least a portion of the connection line is defined in the first organic insulating layer; and
   forming a third line on the first organic insulating layer.

3. The method of claim 2, wherein the first transistor further includes a first gate electrode insulated from the first semiconductor layer, and
   the first gate electrode and the connection line are formed on a same layer and include a same material.

4. The method of claim 2, wherein the first semiconductor layer and the connection line are connected to each other through the first line.

5. The method of claim 2, wherein the second semiconductor layer and the connection line are connected to each other through the second line.

6. The method of claim 2, further comprising: after the forming of the third line,
   forming a second organic insulating layer on the third line, wherein a third hole for exposing at least a portion of the connection line is defined in the second organic insulating layer; and
   forming a pattern material on the connection line and the second organic insulating layer.

7. The method of claim 6, wherein a width across the first hole is greater than a width across the second hole.

8. The method of claim 6, wherein a width across the second hole is greater than a width across the third hole.

9. The method of claim 6, wherein, in the disconnecting of the connection line, the pattern material is etched to form a pixel electrode, and the connection line is etched to form a disconnection portion.

10. The method of claim 9, wherein the pixel electrode does not overlap the disconnection portion.

11. The method of claim 9, further comprising, after the disconnecting of the connection line, forming a pixel defining layer for exposing at least a portion of the pixel electrode.

12. The method of claim 11, wherein at least a portion of the pixel defining layer is formed on the disconnection portion.

13. The method of claim 12, wherein the pixel defining layer directly contacts the connection line.

14. The method of claim 1, wherein the pixel circuit includes a first capacitor and a second capacitor.

15. The method of claim 14, wherein the first capacitor includes a first lower electrode and a first upper electrode insulated from the first lower electrode, and
   the second capacitor includes a second lower electrode spaced apart from the first lower electrode and a second upper electrode insulated from the second lower electrode.

* * * * *